US006379863B1

(12) United States Patent
Oohashi et al.

(10) Patent No.: US 6,379,863 B1
(45) Date of Patent: Apr. 30, 2002

(54) PLANOGRAPHIC PRINTING PLATE PRECURSOR AND A METHOD FOR PRODUCING A PLANOGRAPHIC PRINTING PLATE

(75) Inventors: Hidekazu Oohashi; Koichi Kawamura; Tadahiro Sorori; Morio Yagihara; Sumiaki Yamasaki, all of Shizuoka-ken (JP)

(73) Assignee: Fuji Photo Film Co., Ltd., Minami-Ashigara (JP)

(*) Notice: Subject to any disclaimer, the term of this patent is extended or adjusted under 35 U.S.C. 154(b) by 0 days.

(21) Appl. No.: 09/620,899

(22) Filed: Jul. 20, 2000

Related U.S. Application Data

(63) Continuation of application No. 09/207,682, filed on Dec. 9, 1998, now Pat. No. 6,153,352.

(30) Foreign Application Priority Data

| | | |
|---|---|---|
| Dec. 10, 1997 | (JP) | 9-340358 |
| Dec. 24, 1997 | (JP) | 9-355798 |
| Feb. 26, 1998 | (JP) | 10-45635 |

(51) Int. Cl.[7] .................... G03F 7/09

(52) U.S. Cl. .................... 430/270.1; 430/273.1; 101/453

(58) Field of Search .................... 430/270.1, 273.1, 430/302, 303; 101/453, 463.1, 465

(56) References Cited

U.S. PATENT DOCUMENTS

| | | | | | |
|---|---|---|---|---|---|
| 5,102,771 | A | | 4/1992 | Vogel et al. | 430/270 |
| 5,340,693 | A | | 8/1994 | Uytterhoven et al. | 430/253 |
| 5,385,092 | A | * | 1/1995 | Lewis et al. | 101/467 |
| 5,658,708 | A | | 8/1997 | Kondo | 430/288.1 |
| 5,858,604 | A | | 1/1999 | Takeda et al. | 430/162 |
| 5,948,591 | A | | 9/1999 | Vermeersch et al. | 430/270.1 |
| 5,958,646 | A | | 9/1999 | Kawamura et al. | 430/192 |
| 5,985,514 | A | * | 11/1999 | Zheng et al. | 430/270.1 |
| 6,096,471 | A | * | 8/2000 | Van Damme et al. | 430/188 |
| 6,096,479 | A | * | 8/2000 | Kawamura et al. | 430/270.1 |
| 6,106,996 | A | * | 8/2000 | Van Damme et al. | 430/271.1 |
| 6,110,644 | A | * | 8/2000 | Vermeersch et al. | 430/302 |
| 6,146,812 | A | * | 11/2000 | Leon et al. | 430/270.1 |
| 6,162,578 | A | * | 12/2000 | Zheng et al. | 430/270.1 |
| 6,165,691 | A | * | 12/2000 | Damme et al. | 430/303 |
| 6,300,032 | B1 | * | 10/2001 | Van Damme et al. | 430/188 |

FOREIGN PATENT DOCUMENTS

| | | | |
|---|---|---|---|
| EP | 0559248 | A1 | 9/1993 |
| EP | 0573092 | A1 | 12/1993 |
| EP | 0652483 | A1 | 5/1995 |
| EP | 0703499 | A1 | 3/1996 |
| EP | 0855267 | A2 | 7/1998 |
| EP | 0869394 | A1 | 10/1998 |

* cited by examiner

*Primary Examiner*—Janet Baxter
*Assistant Examiner*—Barbara Gilmore
(74) *Attorney, Agent, or Firm*—Burns, Doane, Swecker & Mathis, LLP

(57) ABSTRACT

A planographic printing plate precursor obtained by laminating on a substrate, a layer composed of a hydrophobic polymer which can be made hydrophilic by heating, and a layer of which exposed portions can be removed by heat mode exposure.

14 Claims, No Drawings

PLANOGRAPHIC PRINTING PLATE PRECURSOR AND A METHOD FOR PRODUCING A PLANOGRAPHIC PRINTING PLATE

This application is a continuation of application Ser. No. 09/207,682, filed Dec. 9, 1998 U.S. Pat. No. 6,153,352.

BACKGROUND OF THE INVENTION

1. Field of the Invention

The present invention relates to a planographic printing plate precursor and a method for producing a planographic printing plate. More particularly, the present invention relates to a planographic printing plate precursor which can be produced by scanning exposure based on digital signals, and a simple method for producing a planographic printing plate using the same.

2. Description of Related Art

A conventional planographic printing plate has been produced by exposing a planographic printing plate precursor to a light through a lith film, then removing non-image portions by dissolving them in a developing solution. Recently, digitalizing technologies have been spread widely in which image information is electronically processed, stored, and output using a computer, and various new image output methods making use of such digitizing technologies have been put into actual use. As a result, a computer-to-plate technology in which active radioactive light having a high directivity such as a laser light is scanned according to image information in the form of digitized data and printing plate is directly produced not via a lith film is eagerly desired, and it is an important technological problem to obtain a printing plate precursor suitable for this. On the other hand, in conventional production processes for a planographic printing plate, a process wherein removing non-image portions by dissolving them after exposure is indispensable. However, since the developing waste solution thereof is alkaline, a method for producing a printing plate which does not require such a wet treatment is eagerly awaited in today's industrial world where great importance is attached to protecting the environment. Thus, because of the already developed technologies for digitalizing image information and the necessity of environmental protection, planographic printing plate precursors which do not require wet treatment and can be produced in dry mode are keenly sought.

Japanese Patent Application Laid-Open (JP-A) Nos. 5-77574, 4-125189, U.S. Pat. No. 5,187,047 and JP-A No. 62-195646 and the like disclose that after image formation, a film produced by sulfonation of polyolefins is used as a planographic printing plate precursor which does not require wet developing treatment, and hydrophilicity of the surface thereof is modified by thermal writing to create a plate precursor material which does not require developing treatment. In this system, an image is formed by de-sulfonating sulfone groups existing on the surface of photosensitive materials by thermal writing, therefore, developing treatment is not necessary, however, there is the drawback that noxious gas is generated in the writing.

U.S. Pat. Nos. 5,102,771 and 5,225,316 suggest a sensitive material obtained by combining a polymer having an acid-sensitive group in the side chain and a photo acid generator, wherein propose a non-developing system. This plate precursor has the drawbacks that the hydrophilicity thereof is low, it is easily contaminated, and the durability of the plate precursor and clearness of the printed image are inferior, since the acid generated is a carboxylic acid.

As image forming materials having radiation sensitivity suitable for the production of positive non-treated planographic printing plates, those described in JP-A No. 7-186562 are known using specific carboxylates or sulfonates as image forming materials. By using the image forming materials described in this publication, there can be obtained a planographic printing plate which can be developed with water giving a satisfactory print, however, if the energy in exposure is low, there is a tendency that the image forming material near the substrate does not become completely hydrophilic and the image forming material can not be removed completely, and accordingly, the resulting print is blemished.

Further, as a method for producing a printing plate by scanning exposure, a method has been suggested utilizing active radioactive light having a high power density. In general, the recording mode by high power density exposure is called heat mode recording. The reason for this is that in a high power density exposure system, it is believed that photo energy absorbed by a sensitive material is often converted into heat, and the desired phenomenon is caused by the heat generated. A large part of the merit in the heat mode recording method resides in the potential possibility of simple treatment, dry treatment, and no-treatment. This is based on the fact that the phenomenon utilized for image recording of a heat mode sensitive material does not substantially occur by exposure to a light of normal strength or under normal environmental temperatures thereby negating the necessity for image fixing after exposure.

As one preferable method of producing a planographic printing plate based on the heat mode recording, there is a method in which a hydrophobic image forming layer is provided on a hydrophilic substrate, the layer is subjected to image-wise heat mode exposure to alter the solubility and dispersibility of the hydrophobic layer, and where necessary, non-image portions are removed by wet development. As an example thereof, Japanese Patent Application Publication (JP-B) No. 46-27919 discloses a method in which a plate precursor comprising a hydrophilic substrate carrying thereon a recording layer which manifests improved solubility (a so-called positive), action by the effect of heat, and specifically a recording layer having a specific composition of saccharides, melamine-formaldehyde resin and the like, is subjected to heat mode recording to obtain a printing plate. However, heat mode scanning exposure sensitivity has been insufficient since none of the disclosed recording layers has satisfactory heat sensitivity. Further, it has been a practical problem that discrimination of hydrophobicity/hydrophilicity before and after exposure, namely a change in solubility is small. For example, for securing hydrophilicity after exposure, a recording layer is forced to become hydrophilic to a certain extent before exposure, and as a result, the ink receiving property of image portions of the resulting printing plate and strength in printing become insufficient.

On the other hand, as another heat mode positive type plate precursor, U.S. Pat. No. 3,574,657 and JP-A No. 50-113307 suggest a plate-precursor having a constitution in which a hydrophobic recording layer which can be removed by heat mode exposure is provided on a hydrophilic substrate. The principle of image recording of this plate precursor is based on the fact that the layer structure of a recording layer is destroyed by exposure, and as a result, the recording layer is removed in the exposure or printing processes, unlike the above-described plate production based on a change in the solubility and dispersibility of a recording layer in a heat mode solution type positive plate precursor. However, in a heat mode exposure removal type positive plate precursor, complete removal of a hydrophobic recording layer is difficult, and manifestation of sufficient hydrophilicity of non-image portions is difficult. On the other hand, there is the dilemma that when the thickness of a recording layer is decreased to enhance the removability thereof, a deterioration is caused in the strength of the image portions, and a printing plate having only a low printing resistance is obtained.

SUMMARY OF THE INVENTION

The present invention has been achieved in consideration of the above-described problems, and an object thereof is to provide a planographic printing plate precursor wherein after scanning exposure for a short period of time, exposed portions (non-image portions) have a high level of hydrophilicity and non-exposed portions (image portions) have a high level of hydrophobicity and strength. Namely, the object thereof is to provide a planographic printing plate precursor with which a planographic printing plate can be produced having excellent printing properties such as resistance to blemishes, printing durability and the like by scanning exposure for a short period of time. Another object thereof is to provide a planographic printing plate precursor with which a planographic printing plate can be produced also having excellent storage stability. Still another object thereof is to provide a method for producing a planographic printing plate which can be developed with water, or does not require additional wet treatment after exposure such as wet developing treatment, rubbing and the like after image writing.

The present inventors have studied intensively to solve the above-described problems, and as a result, found that an excellent planographic printing plate precursor for heat mode exposure is obtained by using a recording layer comprising a polymer compound having in the side chain a functional group which generates a hydrophilic group by heating, and an infrared absorbing agent. As a result of studies, it has been found that a plate precursor is obtained which can provide a planographic printing plate of which image portions have extremely excellent strength and resistance to blemishes, by providing on a substrate a heat sensitive layer composed of the above-described polymer which can be made hydrophilic by heating and a layer having specific functions, thereby achieving the present invention.

Namely, the planographic printing plate precursor of the present invention is obtained by laminating a layer composed of a hydrophobic polymer which can be made hydrophilic by heating (hereinafter, referred to as layer (b)) and either a layer composed of a hydrophilic polymer compound having at least one of alkylene oxide groups or having at least one functional groups selected from —COOR, —COOM, —SOR, —$SO_2R$, —$SO_3R$, —SOM, —$SO_2M$, —$SO_3M$, —OH, —$NR^{22}R^{23}$ (wherein, R represents a hydrogen atom, alkyl group, or aryl group, M represents a metal atom, $R^{22}$ and $R^{23}$ each independently represent a hydrogen atom, alkyl group, or aryl group) (hereinafter, referred to as a layer (a)) or a layer of which exposed portions can be removed by heat mode exposure (hereinafter, referred to as layer (c)).

In particular, the above-described problems are solved by (1) A planographic printing plate precursor obtained by laminating layer (a) and layer (b) in sequence on a substrate having a hydrophilic surface, (2) A planographic printing plate precursor obtained by laminating layer (b) and layer (c) in sequence on a substrate having a hydrophilic surface, or (3) A planographic printing plate precursor obtained by laminating layer (c) and layer (b) in sequence on a substrate having a hydrophilic surface.

In the above-described planographic printing plate precursor (1), when layer (b) composed of a hydrophobic polymer compound which has a specific functional group and is made hydrophilic by heating (hereinafter, referred to where appropriate as a heat sensitive polymer compound) is made hydrophilic image-wise by a specific heating means, because of the existence of a layer composed of a hydrophilic polymer compound which has a specific functional group (referred to as layer (a) including a layer containing only (a-1) described below, a layer containing only (a-2) described below and a layer containing one or more of these) between the substrate and layer (b), exposed portions of layer (b) can be made hydrophilic with high heat efficiency without scattering to the substrate of heat due to the exposure, as a result, sensitivity is improved, and in addition, layer (b) hydrophilizated in non-image portions is solubilized with wetting water and does not remain on the substrate, therefore, the level of blemishing of the resulting print is extremely improved.

The above-described planographic printing plate precursor (2) of the present invention can provide a planographic printing plate which has very high sensitivity and is excellent in strength and blemish resistance of image portions by providing an intermediate layer having a specific function (layer (b)) below layer (c) in a planographic printing plate precursor comprising a substrate of which at least the surface is hydrophilic carrying thereon a lipophilic recording layer which can be removed by irradiation with active radioactive light having high energy density.

In the above-described planographic printing plate (3), light absorption and heat generation in heat mode exposure occur mainly in the intermediate layer (layer (c)) below heat sensitive layer (layer (b)), and the heat sensitive layer is made hydrophilic mainly from the substrate side. It is hypothesized that by this, hydrophilization of the heat sensitive layer becomes more complete. Further, the above-described planographic printing plate (3) manifests sufficient hydrophilicity even in the exposing energy range where hydrophilicity in non-image portions is insufficient on a conventional planographic printing plate precursor (a planographic printing plate precursor comprising a substrate carrying thereon only the intermediate layer of the present invention). Although the mechanism of this hydrophilicity manifestation is not clear, it is considered that providing a heat sensitive layer as an upper layer contributes to making the exposed portions hydrophilic. For example, it is considered that components in the intermediate layer and components in the heat sensitive layer may cause a certain chemical reaction and contribute to making the exposed portions hydrophilic.

DETAILED DESCRIPTION OF THE INVENTION

The above-described layer (a), layer (b) and layer (c) used in the planographic printing plate precursor of the present invention will be described below in detail.

Layer (a)

Layer (a) of the planographic printing plate precursor of the present invention is a layer mainly composed of a hydrophilic polymer compound (a-1) having in the side chain at least one functional group selected from —COOR, —COOM, —SOR, —$SO_2R$, —$SO_3R$, —SOM, —$SO_2M$, —$SO_3M$, —OH, —$NR^{22}R^{23}$ (wherein, R represents a hydrogen atom, alkyl group or aryl group, M represents a metal atom, $R^{22}$ and $R^{23}$ each independently represent a hydrogen atom, alkyl group or aryl group) or a hydrophilic polymer compound (a-2) having at least one alkylene oxide group.

The hydrophilicity of the hydrophilic polymer compound used in the present invention also includes the properties of water-solubility (meaning complete dissolving in water), pseudo water-solubility (meaning amphipatic properties, i.e. where the compound is water-soluble at a macroscopic level but contains non-soluble portions at a microscopic level), and water swelling (meaning the property where the compound swells with water but is not soluble in water). Namely, the compound contains a polymer which adsorbs or absorbs water under conditions of normal use or a polymer which is swollen with or dissolved in water. As compounds which lie within the above-described definition, a hydrophilic polymer compound (a-1) having at least one functional group selected from —COOR, —COOM, —SOR, —$SO_2$R, —$SO_3$R, —SOM, —$SO_2$M, —$SO_3$M, —OH, —$NR^{22}R^{23}$ (wherein, R represents a hydrogen atom, alkyl group or aryl group, M represents a metal atom, $R^{22}$ and $R^{23}$ each independently represent a hydrogen atom, alkyl group, or aryl group) and a hydrophilic polymer compound (a-2) having in the molecule an alkylene oxide group are listed, and known natural polymer compounds or synthetic polymer compounds containing these functional groups can be used.

Examples of synthetic polymer compounds as the hydrophilic polymer compound (a-1) having at least one functional group selected from —COOR, —COOM, —SOR, —$SO_2$R, —$SO_3$R, —SOM, —$SO_2$M, —$SO_3$M, —OH, —$NR^{22}R^{23}$ (wherein, R represents a hydrogen atom, alkyl group or aryl group, M represents a metal atom, $R^{22}$ and $R^{23}$ each independently represent a hydrogen atom, alkyl group or aryl group) include the following compounds: carboxylate salt-based copolymers, N-vinylcarboxylic amide-based copolymers, sulfonate salt-based copolymers, vinylpyrrolidone-based copolymers, polyvinyl alcohol, aqueous urethane resins, water-soluble polyesters, hydroxyethyl(meth)acrylate-based polymers, poly(vinylmethyl ether-co-maleic anhydride), polyethylene glycol di(meth)acrylate-based cross-linked polymers, polypropylene glycol di(meth)acrylate-based cross-linked polymers, and the like.

As the carboxylate salt-based copolymer having —COOR or —COOM in the side chain, there are listed saponification reaction products of carboxylic acid-based copolymers containing as a monomer component an α,β-unsaturated compound having in the molecule one or two carboxyl groups or functional groups which can be converted to carboxyl groups such as a carboxyl group, carboxylate salt, carboxylic amide, carboxylic imide, carboxylic anhydride and the like.

Specific examples of the α,β-unsaturated compound include acrylic acid, methacrylic acid, acrylates, methacrylates, acrylic amides, methacrylic amides, maleic anhydride, maleic acid, maleic amides, maleic imides, itaconic acid, crotonic acid, fumaric acid, mesaconic acid and the like.

Specific examples of the acrylates include methyl acrylate, ethyl acrylate, (n- or i-)propyl acrylate, (n-, i-, sec- or t-)butyl acrylate, amyl acrylate, 2-ethylhexyl acrylate, dodecyl acrylate, chloroethyl acrylate, 2-hydroxyethyl acrylate, 2-hydroxypropyl acrylate, 5-hydroxypentyl acrylate, cyclohexyl acrylate, allyl acrylate, trimethylolpropane monoacrylate, pentaerythritol monoacrylate, benzyl acrylate, methoxybenzyl acrylate, chlorobenzyl acrylate, hydroxybenzyl acrylate, hydroxyphenetyl acrylate, dihydroxyphenetyl acrylate, furfuryl acrylate, tetrahydrofurfuryl acrylate, phenyl acrylate, hydroxyphenyl acrylate, chlorophenyl acrylate, sulfamoylphenyl acrylate, 2-(hydroxyphenylcarbonyloxy)ethyl acrylate, and the like.

Specific examples of the methacrylates include methyl methacrylate, ethyl methacrylate, (n- or i-)propyl methacrylate, (n-, i-, sec- or t-)butyl methacrylate, amyl methacrylate, 2-ethylhexyl methacrylate, dodecyl methacrylate, chloroethyl methacrylate, 2-hydroxyethyl methacrylate, 2-hydroxypropyl methacrylate, 5-hydroxypentyl methacrylate, cyclohexyl methacrylate, allyl methacrylate, trimethylolpropane monomethacrylate, pentaerythritol monomethacrylate, glycidyl methacrylate, benzyl methacrylate, methoxybenzyl methacrylate, chlorobenzyl methacrylate, hydroxybenzyl methacrylate, hydroxyphenetyl methacrylate, dihydroxyphenetyl methacrylate, furfuryl methacrylate, tetrahydrofurfuryl methacrylate, phenyl methacrylate, hydroxyphenyl methacrylate, chlorophenyl methacrylate, sulfamoylphenyl methacrylate, 2-(hydroxyphenylcarbonyloxy)ethyl methacrylate, and the like.

Specific examples of the acrylamides include acrylamide, N-methylacrylamide, N-ethylacrylamide, N-propylacrylamide, N-butylacrylamide, N-benzylacrylamide, N-hydroxyethylacrylamide, N-phenylacrylamide, N-tolylacrylamide, N-(hydroxyphenyl)acrylamide, N-(sulfamoylphenyl)acrylamide, N-(phenylsulfonyl)acrylamide, N-(tolylsulfonyl)acrylamide, N,N-dimethylacrylamide, N-methyl-N-phenylacrylamide, N-hydroxyethyl-N-methylacrylamide, and the like.

Specific examples of the maleic amides include maleic amide, N-methylmaleic amide, N-ethylmaleic amide, N-propylmaleic amide, N-butylmaleic amide, N-benzylmaleic amide, N-hydroxyethylmaleic amide, N-phenylmaleic amide, N-tolylmaleic amide, N-(hydroxyphenyl)maleic amide, N-(sulfamoylphenyl)maleic amide, N-(phenylsulfonyl)maleic amide, N-(tolylsulfonyl)maleic amide, N,N-dimethylmaleic amide, N-methyl-N-phenylmaleic amide, N-hydroxyethyl-N-methylmaleic amide, and the like.

Specific examples of the maleic imides include maleic imide, N-methylmaleic imide, N-ethylmaleic imide, N-propylmaleic imide, N-butylmaleic imide, N-benzylmaleic imide, N-hydroxyethylmaleic imide, N-phenylmaleic imide, N-tolylmaleic imide, N-(hydroxyphenyl)maleic imide, N-(sulfamoylphenyl)maleic imide, N-(phenylsulfonyl)maleic imide, N-(tolylsulfonyl)maleic imide, and the like.

The carboxylate salt-based copolymers used in the present invention may be a homopolymer of the above-described α,β-unsaturated compound, or a copolymer with another copolymerizable monomer providing it has hydrophilicity necessary to the present invention. Examples of the other copolymerizable monomer include known monomers such as ethylene, propylene, isobutylene, 1-butylene, diisobutylene, methyl vinyl ether, acrylonitrile, vinyl esters, styrenes and the like.

Specific examples of the vinyl esters include vinyl acetate, vinyl butyrate, vinyl benzoate, and the like.

Specific examples of the styrenes include styrene, methylstyrene, dimethylstyrene, trimethylstyrene, ethylstyrene, propylstyrene, cyclohexylstyrene, chloromethylstyrene, trifluoromethylstyrene, ethoxymethylstyrene, acetoxymethylstyrene, methoxystyrene, dimethoxystyrene, chlorostyrene, dichlorostyrene, bromostyrene, iodostyrene, fluorostyrene, carboxystyrene, and the like.

When combined with another monomer, the content of an α,β-unsaturated compound containing a carboxyl group or a group which can be converted into a carboxyl group is usually 10 mol % or more, and preferably 40 mol % or more in the whole monomer components.

A polymer contained as the α,β-unsaturated compound containing a carboxyl group or a group which can be converted to a carboxyl group can be produced using known methods (see, e.g., POLYMER CHEMISTRY, vol.7, p. 142 (1950)). Namely, these carboxylate salt copolymers maybe any of random polymers, block polymers, graft polymers and the like, however, random polymers, appropriately selected depending on the polymerization method, are preferable. For example, they are synthesized by radical polymerization using polymerization initiators such as peroxides such as di-t-butyl peroxide, benzoyl peroxide and the like, persulfate salts such as ammonium persulfate and the like, azo compounds such as azobisisobutyronitrile and the like, as well as other compounds. As the polymerization method, solution polymerization, emulsion polymerization, suspension polymerization and the like are adopted.

Examples of suitable solvents used in synthesizing these carboxylate salt-based copolymers include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethylsulfoxide, water and the like. These solvents are used alone or in combinations of two or more.

The degree of polymerization of these carboxylate salt-based copolymers is not particularly restricted.

The polymers or copolymers as explained above are preferably saponified in the presence of an alkaline catalyst. As the solvent used in the saponification, water, alcohol and aqueous alcohol solution are preferable. As the catalyst used for the saponification reaction, known alkaline catalysts are used, and particularly, alkaline metal hydroxides such as sodium hydroxide, potassium hydroxide and the like are suitable. The saponification reaction is accomplished by dissolving or dispersing the above-described polymer or copolymer in the above-described solvent, adding to this an alkaline catalyst and stirring the mixture for 1 to 10 hours at 20 to 80° C.

In the saponification reaction product in the present invention, the salt type thereof can be varied at will according to known methods. As salt-forming substances usually used, there are listed sodium hydroxide, potassium hydroxide, ammonium hydroxide, monomethylamine, dimethylamine, trimethylamine, monoethylamine, diethylamine, triethylamine, monoisopropylamine, diisopropylamine, triisopropylamine, monoethanolamine, diethanolamine, triethanolamine, monoisopropanolamine, diisopropanolamine, triisopropanolamine, N,N-dimethylethanolamine, N,N-dimethylisopropanolamine, cyclohexylamine, benzylamine, aniline, pyridine and the like.

Further, polyvalent metal salts of alkaline earth metal salts such as magnesium, potassium and the like can also be added in the form of a mixed salt with the above-described salts.

Specific examples of the carboxylate salt-based copolymers include compounds such as saponification reaction products of acrylic acid polymers, methacrylic acid polymers or methyl acrylate polymers, saponification reaction products of methacrylic amide copolymers, saponification reaction products of acrylic acid/methacrylic acid copolymers, maleic acid/styrene copolymers or methyl acrylate/vinyl acetate copolymers, and the like.

The term N-vinylcarboxylic amide-based copolymer means a copolymer containing as an essential repeating unit N-vinylcarboxylic amide (hereinafter, abbreviated as NVA) represented by the following general formula (6) (hereinafter, abbreviated as an NVA-based copolymer).

General formula (6)

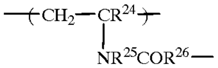

wherein, $R^{24}$ represents a hydrogen atom or an alkyl group having 1 to 4 carbon atoms, $R^{25}$ represents a hydrogen atom, a methyl group, or phenyl group, and $R^{26}$ represents a hydrogen atom or a straight chain or branched chain alkyl group.

Specific examples of the NVA include, but are not limited to, N-vinylformamide, N-vinylpropionic amide, N-vinylbenzoic amide, N-methyl-N-vinylbenzoic amide, N-phenyl-N-vinylacetamide, N-phenyl-N-vinylbenzoic amide, and the like.

The N-vinylcarboxylic amide-based copolymer preferably used in the present invention preferably contains as a copolymer unit an α,β-unsaturated compound having in the molecule one or two carboxyl groups or functional groups which can be derived into a carboxyl group such as a carboxyl group, carboxylate salt, carboxylic amide, carboxylic imide, carboxylic anhydride and the like.

Specific examples of the α,β-unsaturated compound include acrylic acid, methacrylic acid, acrylates, methacrylates, acrylic amides, methacrylic amides, maleic anhydride, maleic acid, maleic amides, maleic imides, itaconic acid, crotonic acid, fumaric acid, mesaconic acid, and the like.

As the specific examples of the acrylates, methacrylates, acrylic amides, methacrylic amides, maleic amides and maleic imides, the compounds described above are listed.

The NVA-based copolymer preferably used in the present invention can contain another copolymerizable monomer providing it has the hydrophilicity necessary to the present invention. Examples of another copolymerizable monomer include known monomers such as ethylene, propylene, isobutylene, 1-butylene, diisobutylene, methyl vinyl ether, acrylonitrile, vinyl esters, styrenes and the like.

As specific examples of the vinyl esters and styrenes, the compounds described above are listed.

The NVA-based copolymer is usually prepared by radical polymerization. These NVA-based copolymers may be any polymer such as random polymers, block polymers, graft polymers and the like, and a random polymer which can be produced by known methods is preferable (see, e.g., POLYMER CHEMISTRY, vol. 7, p. 142 (1950)). Namely, these carboxylate salt-based copolymers may be any of random polymers, block polymers, graft polymers and the like, however, random polymers which are appropriately selected depending on the polymerization method are preferable. For example, they are synthesized by radical polymerization using polymerization initiators such as peroxides such as di-t-butyl peroxide, benzoyl peroxide and the like, persulfate salts such as ammonium persulfate and the like, azo compounds such as azobisisobutyronitrile and the like, as well as other compounds. As the polymerization method, solution polymerization, emulsion polymerization, suspension polymerization and the like are adopted.

Examples of suitable solvents used in synthesizing these NVA-based copolymers include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethylsulfoxide, water and the like. These solvents are used alone or in combination of two or more.

The degree of polymerization of these NVA-based copolymers is not particularly restricted.

Specific examples of the NVA-based copolymer include the following polymers:

Poly (N-vinylacetamide), N-vinylacetamide/(meth) acrylic acid copolymer and partially or completely neutralized compound thereof (partially or completely neutralized compound means a copolymer in which a portion of all the hydrogen ions in a polymerizable functional group such as carboxylic acid, sulfonic acid, phosphoric acid and the like in the copolymer are substituted by an alkaline metal salt such as sodium, potassium and the like or an alkaline metal earth salt such as calcium, barium and the like), N-vinylacetamide/crotonic acid copolymer and partially or completely neutralized compounds thereof, N-vinylacetamide/maleic acid copolymer and partially or completely neutralized compounds thereof, N-vinylacetamide/fumaric acid copolymer and partially or completely neutralized compounds thereof, N-vinylacetamide/citraconic acid copolymer and partially or completely neutralized compounds thereof, N-vinylacetamide/cinnamic acid copolymer and partially or completely neutralized compounds thereof, N-vinylacetamide/vinylsulfonic acid copolymer and partially or completely neutralized compounds thereof, N-vinylacetamide/maleic anhydride copolymer and partially or completely neutralized compounds thereof, N-vinylacetamide/itaconic acid copolymer and partially or completely neutralized compounds thereof, N-vinylacetamide/aconitic acid copolymer and partially or completely neutralized compounds thereof, N-vinylacetamide/3-butenoic acid copolymer and partially or completely neutralized compounds thereof, N-vinylacetamide/4-pentenoic acid copolymer and partially or completely neutralized compounds thereof, N-vinylacetamide/arylsulfonic acid copolymer and partially or completely neutralized compounds thereof, N-vinylacetamide/methallylsulfonic acid copolymer and partially or completely neutralized compounds thereof, N-vinylacetamide/allylphosphoric acid copolymer and partially or completely neutralized compounds thereof, N-vinylacetamide/carboxyethyl acrylate copolymer and partially or completely neutralized compounds thereof, N-vinylacetamide/2-acryloylethylphosphoric acid copolymer and partially or completely neutralized compounds thereof, N-vinylacetamide/3-acryloylpropylphosphoric acid copolymer and partially or completely neutralized compounds thereof, N-vinylacetamide/8-methacryloyloctylphosphoric acid copolymer and partially or completely neutralized compounds thereof, N-vinylacetamide/2-acrylamide-n-propanesulfonic acid copolymer and partially or completely neutralized compounds thereof, N-vinylacetamide/2-acrylamide-n-octanesulfonic acid copolymer and partially or completely neutralized compounds thereof, N-vinylacetamide/2-acrylamide-2-methylpropanesulfonic acid copolymer and partially or completely neutralized compounds thereof, and the like.

As the sulfonate salt-based copolymer having in the side chain —$SO_3R$ or —$SO_3M$, there are listed copolymers containing as the monomer component an unsaturated compound having in the molecule a sulfonate salt or a functional group which can be derived into a sulfonate salt such as a sulfonic amide, sulfonate and the like, or saponification reaction products of the copolymers. As specific examples of such unsaturated compounds, the following compounds are listed.

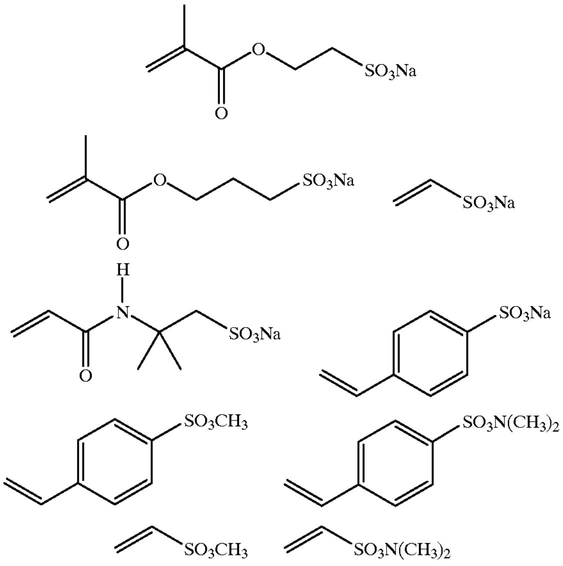

Homopolymers obtained by using only one of these monomers may be used, however, copolymers obtained by using two or more of them and copolymers of these monomers with other monomers may also be used providing they manifest the hydrophilicity necessary to the present invention.

Examples of the copolymerizable other monomer include known monomers such as ethylene, propylene, isobutylene, 1-butylene, diisobutylene, methyl vinyl ether, acrylonitrile, acrylates, methacrylates, acrylamides, methacrylamides, vinyl esters, styrenes and the like.

Specific examples of the acrylates, methacrylates, acrylamides, methacrylamides, vinyl esters and styrenes include are as described above.

The polymer containing as a monomer an unsaturated compound containing a sulfonate salt or a group which can be converted to this is usually prepared by radical polymerization. These sulfonate salt-based copolymers may be any polymer such as random polymers, block polymers, graft polymers and the like, and a random polymer is preferable. They can be produced by known methods (see, e.g., POLYMER CHEMISTRY, vol. 7, p. 142 (1950)). Namely, these carboxylate salt copolymers may be any of random polymers, block polymers, graft polymers and the like, however, preferably, they are random polymers, and are appropriately selected depending on the polymerization method. For example, they are synthesized by radical polymerization using polymerization initiators such as peroxides such as di-t-butyl peroxide, benzoyl peroxide and the like, persulfate salts such as ammonium persulfate and the like, azo compounds such as azobisisobutyronitrile and the like, as well as other compounds. As the polymerization method, solution polymerization, emulsion polymerization, suspension polymerization and the like are adopted.

Examples of suitable solvents used in synthesizing these sulfonate salt-based copolymers include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethylsulfoxide, water and the like. These solvents are used alone or in combinations of two or more.

The degree of polymerization of these sulfonate salt-based copolymers is not particularly restricted.

The copolymers as explained above are preferably saponified in the presence of an alkaline catalyst. As the solvent used in the saponification, water, alcohol and aqueous alcohol solution are preferable. As the catalyst used for the saponification reaction, known alkaline catalysts are used, and particularly, alkaline metal hydroxides such as sodium hydroxide, potassium hydroxide and the like are suitable. The saponification reaction is accomplished by dissolving or dispersing the above-described polymer or copolymer in the above-described solvent, adding to this an alkaline catalyst and stirring the mixture for 1 to 24 hours at 20 to 80° C.

In the saponification reaction product in the present invention, the type of salt can be varied at will according to known methods. As salt-forming substances usually used, there are listed sodium hydroxide, potassium hydroxide, ammonium hydroxide, monomethylamine, dimethylamine, trimethylamine, monoethylamine, diethylamine, triethylamine, monoisopropylamine, diisopropylamine, triisopropylamine, monoethanolamine, diethanolamine, triethanolamine, monoisopropanolamine, diisopropanolamine, triisopropanolamine, N,N-dimethylethanolamine, N,N-dimethylisopropanolamine, cyclohexylamine, benzylamine, aniline, pyridine and the like.

Further, polyvalent metal salts of alkaline earth metal salts such as magnesium, potassium and the like can also be added in the form of a mixed salt with the above-described salts.

Specific examples of the sulfonate salt-based copolymers include the following polymers:

(1)

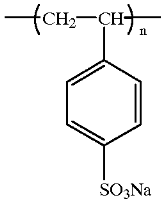

(2)

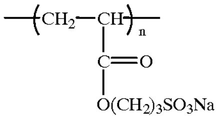

-continued (3)

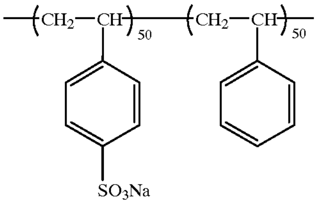

(4)

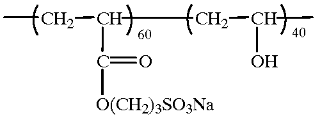

(5)

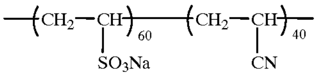

Examples of polymers having preferable hydrophilicity for sufficiently manifesting the effect of the present invention in the above-described hydrophilic polymer compound include carboxylate salt-based copolymers, NVA-based copolymers, sulfonate salt-based copolymers and polyvinyl alcohol, and more preferably carboxylate salt-based copolymers, NVA-based copolymers and sulfonate salt-based copolymers.

Among the carboxylate salt-based copolymers, preferable are polymers or copolymers with acrylic acid and methacrylic acid, and copolymers of an α-olefin or vinyl compound with maleic anhydride, and more preferable are saponification reaction products of a vinyl ester with a (meth)acrylate copolymer (in the following explanation, acid is the abbreviation of acrylic acid and/or-methacrylic acid). In this copolymer, it is preferable that the (meth) acrylate component occupies 20 to 80 mol % of the copolymer, and it is more preferable that the component occupies 30 to 70 mol % of the copolymer for satisfying simultaneously water absorption and mechanical strength requirements of the layer (a).

Among the NVA-based copolymers, preferable are copolymers of NVA with a carboxylic acid such as acrylic acid, methacrylic acid, maleic anhydride and the like, and from the viewpoints of water absorption and durability, the NVA unit occupies preferably 10 mol % or more, and more preferably 40 mol % or more of the whole monomer.

Further, preferable as the sulfonate salt-based copolymer are polymers and copolymers of styrenesulfonate salts and styrenesulfonates, copolymers of styrenesulfonate salts or styrenesulfonates with (meth)acrylic acid, (meth)acrylate, vinyl ester and/or maleic anhydride, or saponification reaction products of these polymers and copolymers. From the viewpoints of water absorption and durability, the styrenesulfonate salt or styrenesulfonate occupies preferably 20 mol % or more, and more preferably 50 mol % or more of the whole monomers.

Examples of natural polymer compounds as the hydrophilic polymer compounds having in the side chain a functional group selected from —COOR, —COOM, —SOR, —$SO_2R$, —$SO_3R$, —SOM, —$SO_2M$, —$SO_3M$, —OH, —$NR^{22}R^{23}$ include starch-styrenesulfonic acid-based graft polymers, starch-vinylsulfonic acid-based graft polymers, starch-acrylamide-based graft polymers, carboxylated methylcellulose, cellulose-styrenesulfonic acid-based graft polymers, carboxymethylcellulose-based cross-linked compounds, and the like.

The hydrophilic polymer compound having an alkylene oxide group in the molecule (a-2) used in the present invention is not particularly restricted providing it has an alkylene oxide group in the main chain or side chain, specific examples thereof include polyethylene oxide, poly (ethylene oxide-co-propylene oxide) and the like, and examples of the natural polymer compound include starch-acrylonitrile-based graft polymer hydrolyzate, starch-acrylic acid-based graft polymers, methylcellulose, hydroxypropylmethylcellulose, hydroxyethylcellulose, xanthic acid cellulose, cellulose-acrylonitrile-based graft copolymers, hyarulonic acid, agarose, collagen, milk casein, acid casein, rennet casein, ammonia casein, potassium casein, borax casein, glue, gelatin, gluten, soy bean protein, alginate, ammonium alginate, potassium alginate, sodium alginate, gum arabic, tragacanth gum, karaya gum, guar gum, locustbean gum, Irish moss, soy bean lecithin, pectinic acid, starch, carboxylated starch, agar, dextrin, mannan, and the like. The layer (a-1), (a-2) or (a) in the present invention may optionally contain compounds described below as constituent components in addition to the above-described hydrophilic polymer compounds within a range wherein the effect of the present invention is not lost.

Into the layer (a) of the planographic printing plate of the present invention, there can be added, for enhancing stability in the printing conditions, nonionic surfactants as described in JP-A Nos. 62-251740 and 3-208514, and ampholytic surfactants as described in JP-A Nos. 59-121044 and 4-13149.

Specific examples of the nonionic surfactant include sorbitantristearate, sorbitanmonopalmitate, sorbitantrioleate, stearic acid monoglyceride, polyoxyethylenenonyl phenyl ether, and the like.

Specific examples of the ampholytic surfactant include alkyldi(aminoethyl)glycine, alkylpolyaminoethylglycine hydrochloride, 2-alkyl-N-carboxyethyl-N-hydroxyethylimidazolinium betaine, N-tetradecyl-N,N-betaine type (for example, trade name: AMOGEN K, manufactured by Dai-itchi Kogyo Siyaku. Co., Ltd.), and the like.

The proportion of the above-described nonionic surfactant and ampholytic surfactant based on the total weight of solid components of this hydrophilic layer is preferably from 0.05 to 15% by weight, and more preferably from 0.1 to 5% by weight.

A photo-thermal conversion material is preferably added to layer (a). Various infrared ray absorbing dyes can be preferably used as the photo-sensitive conversion material. The dye I represented by the following formula is especially preferable.

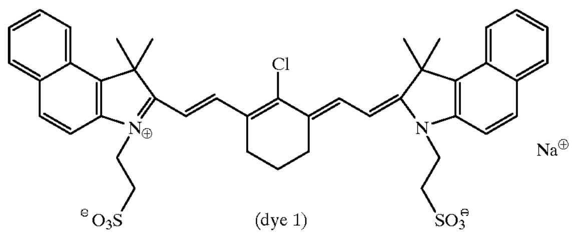

$Na^{\oplus}$ (dye 1)

The layer (a) of the planographic printing plate of the present invention can be produced usually by dissolving the above-described components in a solvent and coating the mixture on a suitable substrate.

Examples of the solvent herein used include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene, water, and the like.

These solvent are used alone or in a mixture. The concentration of the above-described components (whole solid components) in the solvent is preferably from 1 to 50% by weight.

Various methods can be used for the coating, and examples thereof include bar coater coating, rotation coating, spray coating, curtain coating, dip coating, air knife coating, blade coating, roll coating and the like.

Into the layer (a) of the planographic printing plate of the present invention, there can be added surfactants for enhancing coatability, for example, fluorine-based surfactants as described in JP-A No. 62-170950. The preferable amount added is from 0.01 to 1% by weight, and more preferably from 0.05 to 0.5% by weight based on the total weight of solid components in the layer (a).

Layer (a) manifests functions of securing a hydrophilic surface in exposed portions and improving heat efficiency, and therefore, the amount coated (solid component) on the substrate obtained after coating and drying is, in general, preferably from 0.5 $mg/m^2$ to 1.0 $g/m^2$, more preferably from 1 $mg/m^2$ to 500 $g/m^2$, and most preferably from 2 $mg/m^2$ to 300 $g/m^2$.

When the amount coated is less than 0.5 $g/m^2$, the effect for improving heat efficiency becomes insufficient, and even if the mixture is coated at an amount over 1.0 $g/m^2$, improvement in the effect is not recognized, on the contrary, printing durability unpreferably deteriorates.

Layer (b)

Layer (b) of the planographic printing plate precursor of the present invention changes to hydrophilic from hydrophobic and the solubility and dispersibility thereof the water increase by the action of heat. The change in hydrophobicity/hydrophilicity can be confirmed by for example solubility, dispersibility and wetting property (contact angle) in water. For example, a heat sensitive layer of which the contact angle against a water drop in air decreases by 10° or more by heating is preferable, and 40° or more is more preferable. Particularly preferably, the heat sensitive layer is essentially insoluble in water before heating, and becomes soluble or dispersible in water by heating.

As preferable examples of the layer (b) having this property, there are listed polymers which can generate a sulfonic acid in the side chain by heating (hereinafter, referred to as "sulfonic acid generating polymers") and polymers which can generate a carboxylic acid in the side chain by heating (hereinafter, referred to as "carboxylic acid generating polymers") . These polymers, before heating, have a hydrophobic sulfonate or carboxylate structure and carry in the side chain a group which is converted to a hydrophilic sulfonic acid structure or carboxylic acid structure by heating. Though carboxylates turn to carboxylic acids even by simply heating, it is preferable to use the carboxylates together with a compound which generates an acid by heating (hereinafter, referred to as "heat acid generator") since the reaction is accelerated in the presence of an acid. In addition, if the sulfonates are combined with a heat acid generator the reaction, may, in some cases, be accelerated.

The hydrophobic polymer compound is a polymer carrying in the side chain at least one of the groups represented by the above-described formulae (1) to (5). Sulfonic acid generating polymers having a group represented by the formulae (1) to (3) are preferable in that discrimination of hydrophobicity to hydrophilicity before and after recording by irradiation with a light is excellent.

General formula (1)

$$—L—SO_2—O—R^1$$

General formula (2)

$$—L—SO_2—SO_2—R^2$$

General formula (3)

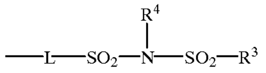

Polymers which can generate a sulfonic acid in the side chain represented by the above-described formulae (1) to (3) by heating are described in detail below.

In the formulae (1) to (3), L represents an organic group composed of a polyvalent non-metal atom necessary for connecting a substituent to a polymer main chain. The substituent herein referred to is a sulfonate group. $R^1$ represents a substituted or unsubstituted alkyl group, a substituted or un-substituted aryl group, or a cyclic imide group, $R^2$ and $R^3$ represent a substituted or unsubstituted alkyl group or a substituted or unsubstituted aryl group, $R^4$ represents a substituted or unsubstituted alkyl group, a substituted or unsubstituted aryl group, or $—SO_2—R^5$. $R^5$ represents a substituted or unsubstituted alkyl group or a substituted or unsubstituted aryl group.

Preferable examples of $R^1$ to $R^5$ will be specifically described below. As the preferable example of the unsubstituted alkyl group $R^1$, straight chain, branched chain and cyclic alkyl groups having 1 to 20 carbon atoms are listed, and specific examples thereof include a methyl group, ethyl group, propyl group, butyl group, pentyl group, hexyl group, heptyl group, octyl group, nonyl group, decyl group, undecyl group, dodecyl group, tridecyl group, hexadecyl group, octadecyl group, eicosyl group, isopropyl group, isobutyl group, s-butyl group, t-butyl group, isopentyl group, neopentyl group, 1-methylbutyl group, isohexyl group, 2-ethylhexyl group, 2-methylhexyl group, cyclohexyl group, cyclopentyl group, and 2-norbornyl group. Among these, straight-chain alkyl groups having 1 to 12 carbon atoms, branched-chain alkyl groups having 3 to 12 carbon atoms, and cyclic alkyl groups having 5 to 10 carbon atoms are preferable.

When $R^1$ represents a substituted alkyl group, as the substituent of the substituted alkyl group, monovalent non-metal atom groups other than hydrogen are used, and preferable examples thereof include halogen atoms (—F, —Br, —Cl, —I), a hydroxyl group, alkoxy group, aryloxy group, mercapto group, alkylthio group, arylthio group, alkyldithio group, aryldithio group, amino group, N-alkylamino group, N,N-dialkylamino group, N-arylamino group, N,N-diarylamino group, N-alkyl-N-arylamino group, acylamino group, carbamoyloxy group, N-alkylcarbamoyloxy group, N-arylcarbamoyloxy group, N,N-dialkylcarbamoyloxy group, N,N-diarylcarbamoyloxyl group, N-alkyl-N-arylcarbamoyloxy group, alkylsulfoxy group, arylsulfoxy group, acylthio group, acylamino group, N-alkylacylamino group, N-arylacylamino group, ureido group, N'-alkylureido group, N',N'-dialkylureido group, N'-arylureido group, N',N'-diarylureido group, N'-alkyl-N'-arylureido group, N-alkylureido group, N-arylureido group, N-alkyl-N-alkylureido group, N-alkyl-N-arylureido group, N',N'-dialkyl-N-alkylureido group, N',N'-dialkyl-N-arylureido group, N'-aryl-N-alkylureido group, N'-aryl-N-arylureido group, N',N'-diaryl-N-alkylureido group, N',N'-diaryl-N-arylureido group, N-alkyl-N'-aryl-N-alkylureido group, N'-alkyl-N'-aryl-N-arylureido group, alkoxycarbonylamino group, aryloxycarbonylamino group, N-alkyl-N-alkoxycarbonylamino group, N-alkyl-N-aryloxycarbonylamino group, N-aryl-N-alkoxycarbonylamino group, N-aryl-N-aryloxycarbonylamino group, formyl group, acyl group, carboxyl group, alkoxycarbonyl group, aryloxycarbonyl group, carbamoyl group, N-alkylcarbamoyl group, N,N-dialkylcarbamoyl group, N-arylcarbamoyl group, N,N-diarylcarbamoyl group, N-alkyl-N-arylcarbamoyl group, alkylsulfinyl group, arylsulfinyl group, alkylsulfonyl group, arylsulfonyl group, sulfo ($—SO_3H$) and conjugated basic groups thereof (hereinafter, abbreviated as a sulfonato group), alkoxysulfonyl group, aryloxysulfonyl group, sulfinamoyl group, N-alkyl sulfinamoyl group, N,N-dialkyl sulfinamoyl group, N-arylsulfinamoyl group, N,N-diarylsulfinamoyl group, N-alkyl-N-arylsulfinamoyl group, sulfamoyl group, N-alkylsulfamoyl group, N,N-dialkylsulfamoyl group, N-arylsulfamoyl group, N,N-diarylsulfamoyl group, N-alkyl-N-arylsulfamoyl group, phosphono group ($—PO_3H_2$) and conjugated basic groups thereof (hereinafter, abbreviated as a phosphonato group), dialkylphosphono group ($—PO_3(alkyl)_2$) , diarylphosphono group ($—PO_3(aryl)_2$), alkylarylphosphono group ($—PO_3$ (alkyl) (aryl)), monoalkylphosphono group ($—PO_3$(alkyl)), monoarylphosphono group ($—PO_3$(aryl)) and conjugated basic groups thereof (hereinafter, abbreviated as an arylphosphonato group), phosphonooxy group ($—PO_3H_2$) and conjugated basic groups thereof (hereinafter, abbreviated as a phosphonatooxy group), dialkylphosphonooxy group ($—OPO_3(alkyl)_2$), diarylphosphonooxy group ($—OPO_3(aryl)_2$), alkylarylphosphonooxy group ($—OPO_3$ (alkyl) (aryl)), monoalkylphosphonooxy group ($—OPO_3H$ (alkyl)) and conjugated basic groups thereof (hereinafter, abbreviated as an alkylphosphonatooxy group), monoarylphosphonooxy group ($—OPO_3H$(aryl)) and conjugated basic group thereof (hereinafter, abbreviated as an arylphosphonatooxy group), cyano group, nitro group, aryl group, alkenyl group, and alkynyl group.

In the substituent of the substituted alkyl group, specific examples of the alkyl group include the alkyl groups as described above, and specific examples of the aryl group include a phenyl group, biphenyl group, naphthyl group, tolyl group, xylyl group, mesityl group, cumenyl group, chlorophenyl group, bromophenyl group, chloromethylphenyl group, hydroxyphenyl group, methoxyphenyl group, ethoxyphenyl group, phenoxyphenyl group, acetoxyphenyl group, benzoyloxyphenyl group, methylthiophenyl group, phenylthiophenyl group, methylaminophenyl group, dimethylaminophenyl group, acetylaminophenyl group, carboxyphenyl group, methoxycarbonylphenyl group, ethoxyphenylcarbonyl group, phenoxycarbonylphenyl group, N-phenylcarbamoylphenyl group, phenyl group, cyanophenyl group, sulfophenyl group, sulfonatophenyl group, phosphonophenyl group, phosphonatophenyl group, and the like. Examples of an alkenyl group include a vinyl group, 1-propenyl group, 1-butenyl group, cinnamyl group, 2-chloro-1-ethenyl group, and the like. Examples of the alkenyl group include an ethynyl group, 1-propenyl group, 1-butynyl group, trimethylsilylethynyl group, and the like. As $G^1$ in the acyl group ($G^1CO—$), hydrogen, and the above-described alkyl groups and aryl groups are listed. Among these substituents, more preferable examples include halogen atoms (—F, —Br, —Cl, —I), an alkoxy group, aryloxy group, alkylthio group, arylthio group, N-alkylamino group, N,N-dialkylamino group, acyloxy group, N-alkylcarbamoyloxy group, N-arylcarbamoyloxy group, acylamino group, formyl group, acyl group, carboxyl group, alkoxycarbonyl group, aryloxycarbonyl group, carbamoyl group, N-akylcarbamoyl group, N,N-dialkylcarbamoyl group, N-arylcarbamoyl group, N-alkyl-N-arylcarbamoyl group, sulfo group, sulfonato group, sulfamoyl group, N-alkylsulfamoyl group, N,N-dialkylsulfamoyl group, N-arylsulfamoyl group , N-alkyl-N-arylsulfamoyl group, phosphono group, phosphonato group, dialkylphosphono group, diarylphosphono group, monoalkyphosphono group, alkylphosphonato group, monoarylphosphono group, arylphosphonato group, phosphonooxy group, phosphonatooxy group, aryl group, and alkenyl group.

When $R^1$ is a substituted alkyl group, as the alkylene group in the substituted alkyl group, there are listed divalent organic residual groups obtained by removing any one hydrogen atom from the above-described alkyl groups having 1 to 20 carbon atoms, and straight-chain alkylene groups having 1 to 12 carbon atoms, branched-chain alkylene groups having 3 to 12 carbon atoms and cyclic alkylene groups having 5 to 10 carbon atoms are preferable. Preferable specific examples of the substituted alkyl groups obtained by combining the above-described substituents with alkylene groups include a chloromethyl group, bromomethyl group, 2-chloroethyl group, trifluoromethyl group, methoxymethyl group, methoxyethoxyethyl group, allyloxymethyl group, phenoxymethyl group, methylthiomethyl group, tolylthiomethyl group, ethylaminoethyl group, diethylaminopropyl group, morpholinopropyl group, acetyloxymethyl group, benzoyloxymethyl group, N-cyclohexylcarbamoyloxyethyl group, N-phenylcaramoyloxyethyl group, acetylaminoethyl group, N-methylbenzoylaminopropyl group, 2-oxoethyl group, 2-oxopropyl group, carboxypropyl group, methoxycarbonylethyl group, allyloxycarbonylbutyl group, chlorophenoxycarbonylmethyl group, carbamoylmethyl group, N-methylcarbamoylethyl group, N,N-dipropylcarbamoylmethyl group, N-(methoxyphenyl) carbamoylethyl group, N-methyl-N-(sulfophenyl) carbamoylmethyl group, sulfobutyl group, sulfonatobutyl group, sulfamoylpropyl group, N-tolylsulfamoylpropyl group, N-methyl-N-(phosphonophenyl)sulfamoyloctyl group, phosphonobutyl group, phosphonatohexyl group, diethylphosphonobutyl group, diphenylphosphonopropyl group, methylphosphonobutyl group, methylphosphonatobutyl group, tolylphosphonohexyl group, tolylphosphonatohexyl group, phosphonooxypropyl group, phosphonatooxybutyl group, benzyl group, phenetyl gtoup, α-methylbenzyl group, 1-methyl-1-phenylethyl group, p-methylbenzyl group, cinnamyl group, allyl group, 1-propenylmethyl group, 2-butenyl group, 2-methylallyl group, 2-methylpropenylmethyl group, 2-propenyl group, 2-butynyl group, 3-butynyl group, and the like.

When $R^1$ is a unsubstituted aryl group, as preferable examples of the unsubstituted aryl group, condensed ring groups formed with 1 to 3 benzene rings, and condensed ring groups formed from a benzene ring and a 5-membered unsaturated ring, are listed, and specific examples thereof include a phenyl group, naphthyl group, anthryl group, phenanthryl group, indenyl group, acenaphthenyl group and fluorenyl group. Among these, a phenyl group and naphthyl group are more preferable. The aryl group includes, in addition to the above-described carbon cyclic aryl groups, heterocyclic aryl groups. As the heterocyclic aryl group, there are used those having 3 to 20 carbon atoms and 1 to 5 hetero atoms such as a pyridyl group, furyl group, and quinolyl group obtained by ring-condensation of a benzene group, benzofuryl group, thioxanthone group, carbazol groups and the like.

When $R^1$ is a substituted aryl group, as examples of the substituted aryl group, the above-described type aryl groups carrying a monovalent non-metal atom group except hydrogen may be used as the substituent on ring-forming carbon atoms. As examples of preferable substituents, the above-described substituted or unsubstituted alkyl groups, and those previously exemplified as substituents on the substituted alkyl groups, are listed. Preferable specific examples of the substituted aryl group include a biphenyl group, tolyl group, xylyl group, mesityl group, cumenyl group, chlorophenyl group, bromophenyl group, fluorophenyl group, chloromethylphenyl group, trifluoromethylphenyl group, hydroxyphenyl group, methoxyphenyl group, methoxyethoxyphenyl group, allyloxyphenyl group, phenoxyphenyl group, methylthiophenyl group, tolylthiophenyl group, ethylaminophenyl group, diethylaminophenyl group, morpholinophenyl group, acetyloxyphenyl group, benzoyloxyphenyl group, N-cyclohexylcarbamoyloxyphenyl group, N-phenylcarbamoyloxyphenyl group, acetylaminophenyl group, N-methylbenzoylaminophenyl group, carboxyphenyl group, methoxycarbonylphenyl group, allyloxycarbonylphenyl group, chlorophenoxycarbonylphenyl group, carbamoylphenyl group, N-methylcarbamoylphenyl group, N,N-dipropylcarbamoylphenyl group, N-(methoxyphenyl) carbamoylphenyl group, N-methyl-N-(sulfophenyl) carbamoylphenyl group, sulfophenyl group, sulfonatophenyl group, sulfamoylphenyl group, N-ethylsulfamoylphenyl group, N,N-dipropylsulfamoylphenyl group, N-tolylsulfamoylphenyl group, N-methyl-N-(phosphonophenyl)sulfamoylphenyl group, phosphonophenyl group, phophonatophenyl group, diethylphosphonophenyl group, diphenylphosphonophenyl group, methylphosphonophenyl group, methylphosphonatophenyl group, tolylphosphonophenyl group, tolylphosphonatophenyl group, allyl group, 1-propenylmethyl group, 2-butenyl group, 2-methylallylphenyl group, 2-methylpropenylphenyl group, 2-propenylphenyl group, 2-butynylphenyl group, 3-butynylphenyl group and the like.

When $R^1$ is a cyclic imide group, as preferable examples of the cyclic imide group, those having 4 to 20 carbon atoms such as succinic imide, phthalic imide, cyclohexanedicarboxylic imide, norbornenedicarboxylic imide and the like are listed.

Among other, it is particularly preferable from the view points of storability and heat decomposability when $R^1$ is a primary or secondary alkyl which may have a substituent.

When $R^2$ and $R^3$ represent a substituted or unsubstituted alkyl group, or substituted or unsubstituted aryl group, preferable examples thereof are the same as the preferable examples of the substituted or unsubstituted alkyl group, or substituted or unsubstituted aryl group of $R^1$.

When $R^4$ represents a substituted or unsubstituted alkyl group, or substituted or unsubstituted aryl group, preferable examples thereof are the same as the preferable examples of the substituted or unsubstituted alkyl group, or substituted or unsubstitutedaryl group of $R^1$. When $R^4$ is $—SO_2—R^5$, $R^5$ represents a substituted or unsubstituted alkyl group, or substituted or unsubstituted aryl group. When $R^5$ represents a substituted or unsubstituted alkyl group, or substituted or unsubstituted aryl group, preferable examples thereof are the same as the preferable examples of the substituted or unsubstituted alkyl group, or substituted or unsubstituted aryl group of $R^1$.

L connects a polymer main chain with a sulfonate group which is a substituent thereof, in a sulfonic acid generating polymer. The organic group composed of a polyvalent non-metal atom represented by L is an organic group composed of 1 to 60 carbon atoms, 0 to 10 nitrogen atoms, 0 to 50 oxygen atoms, 1 to 100 hydrogen atoms and 0 to 20 sulfur atoms. As more specific organic groups, those constituted of combinations of the following structural units are listed.

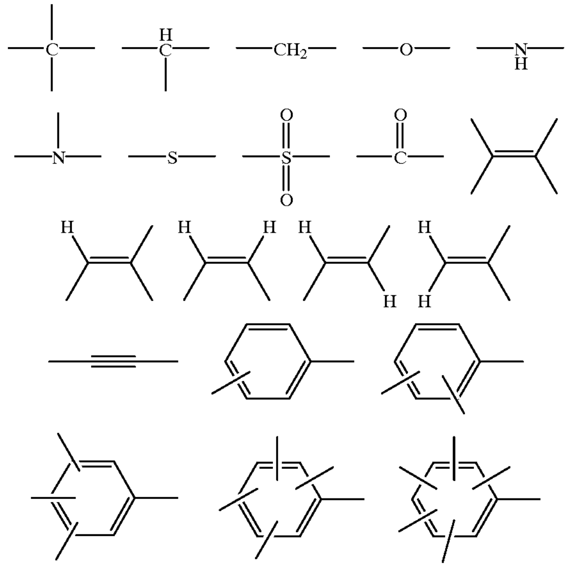

Polyvalent naphthalene

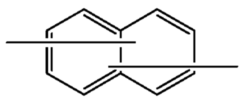

Polyvalent anthracene

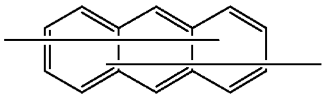

When L has a substituent, as the substituent, there can be used alkyl groups having 1 to 20 carbon atoms such as a methyl group, ethyl group and the like, aryl groups having 6 to 16 carbon atoms such as a phenyl group, naphthyl group, and the like, acyloxy groups having 1 to 6 carbon atoms such as a hydroxyl group, carboxyl group, sulfonamide group, N-sulfonylamide group and acetoxy group, alkoxy groups having 1 to 6 carbon atoms such as a methoxy group and ethoxy group, halogen atoms such as chlorine and bromine, alkoxycarbonyl groups having 2 to 7 carbon atoms such as a methoxycarbonyl group, ethoxycarbonyl group and cyclohexyloxycarbonyl group, a cyano group, carbonates such as t-butyl carbonate, and the like.

The sulfonic acid generating polymers in the present invention can be produced by conventionally known various polymerization methods such as radical polymerization, ion polymerization, polycondensation and the like. For example, the sulfonic acid generating polymers are obtained by radical polymerization using the radical polymerizable monomers shown below.

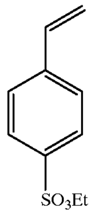

(1m-1)

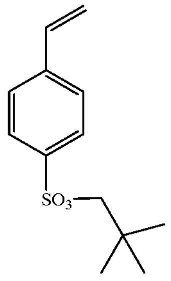

(1m-2)

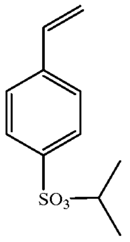

(1m-3)

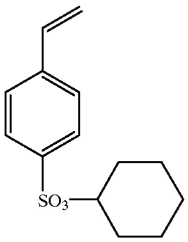

(1m-4)

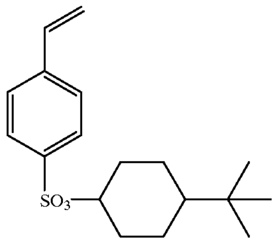

(1m-5)

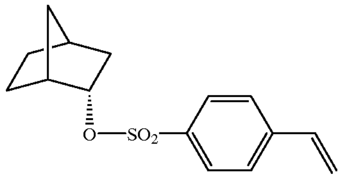

(1m-6)

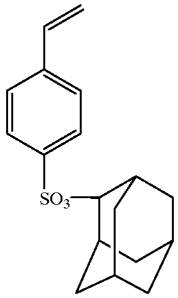

(1m-7)

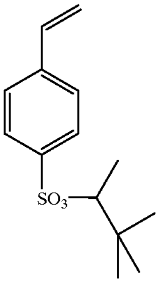

(1m-8)

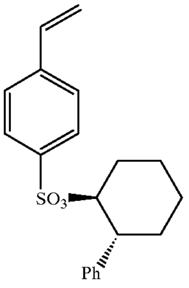

(1m-9)

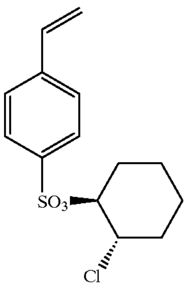

(1m-10)

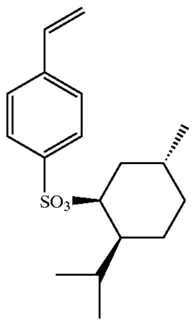

(1m-11)

-continued
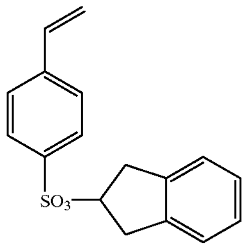
(1m-12)
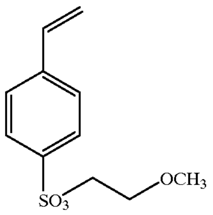
(1m-13)
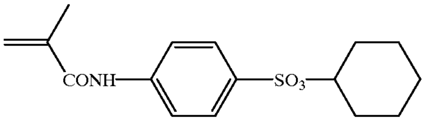
(1m-14)
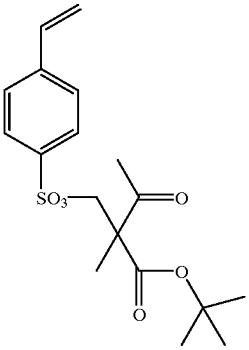
(1m-15)
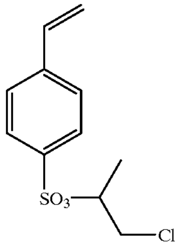
(1m-16)
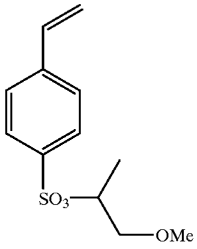
(1m-17)
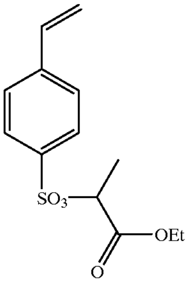
(1m-18)
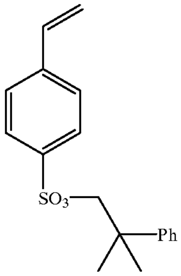
(1m-19)
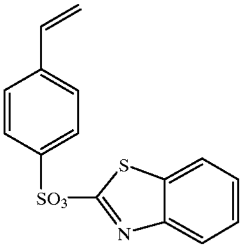
(1m-20)
-continued
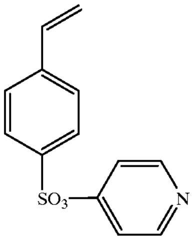
(1m-21)
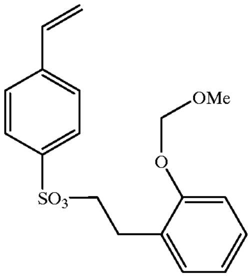
(1m-22)
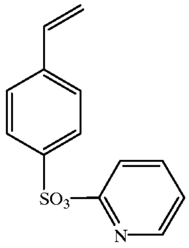
(1m-23)
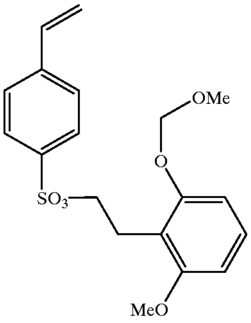
(1m-24)
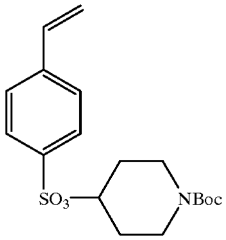
(1m-25)
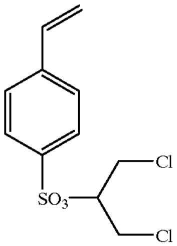
(1m-26)
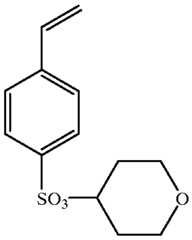
(1m-27)
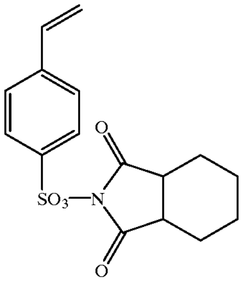
(1m-28)
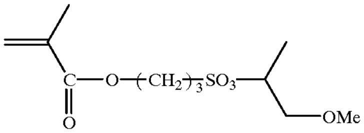
(1m-29)
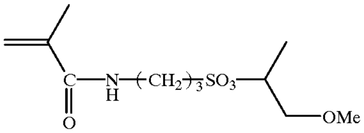
(1m-30)

-continued

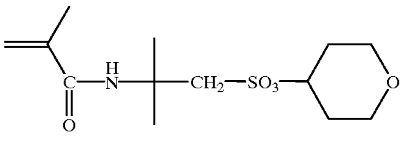

(1m-31)

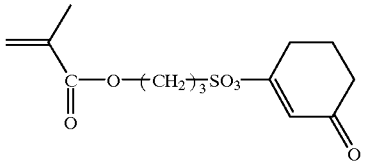

(1m-32)

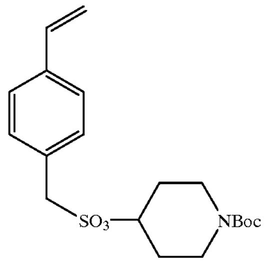

(1m-33)

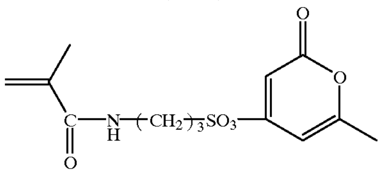

(1m-34)

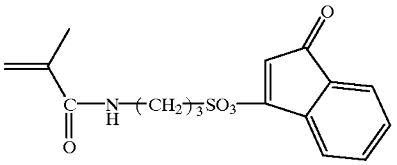

(1m-35)

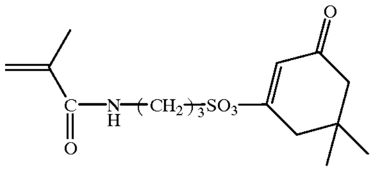

(1m-36)

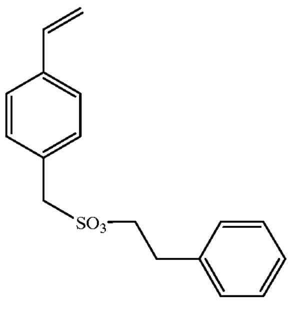

(1m-37)

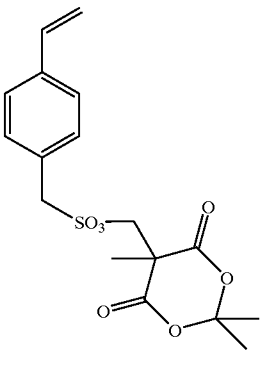

(1m-38)

-continued

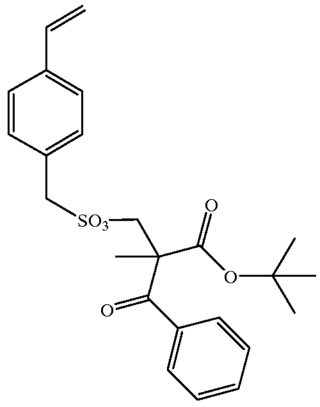

(1m-39)

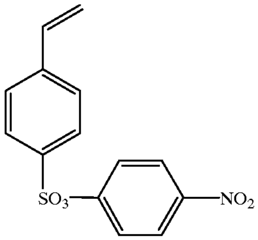

(1m-40)

For obtaining the sulfonic acid generating polymer, only one of the monomers having the partial structures represented by the formulae (1) to (3) described above may be homo-polymerized or two or more of the monomers may be copolymerized. Further, there may be used a copolymer obtained by copolymerizing a monomer having a partial structure represented by the formulae (1) to (3) with another monomer. As examples of such a copolymer, there are listed those obtained by radical-copolymerization of exemplified radical-polymerizable monomers with other radical-polymerizable monomers.

Examples of the other monomers used include known monomers such as acrylates, methacrylates, acrylamides, methacrylamides, vinyl esters, styrenes, acrylic acid, methacrylic acid, acrylonitrile, maleic anhydride, maleic imide and the like. By copolymerizing such monomers, various physical properties such as film formability, film strength, hydrophilicity, hydrophobicity, solubility, reactivity, stability and the like can be improved.

Specific examples of the acrylates include methyl acrylate, ethyl acrylate, (n- or i-)propyl acrylate, (n-, i-, sec- or t-)butyl acylate, amyl acrylate, 2-ethylhexyl acrylate, dodecyl acrylate, chloroethyl acrylate, 2-hydroxyethyl acrylate, 2-hydroxypropyl acrylate, 5-hydroxypentyl acrylate, cyclohexyl acrylate, allyl acrylate, trimethylolpropane monoacrylate, pentaerythritol monoacrylate, benzyl acrylate, methoxybenzyl acrylate, chlorobenzyl acrylate, hydroxybenzyl acrylate, hydroxyphenethyl acrylate, dihydroxyphenethyl acrylate, furfuryl acrylate, tetrahydrofurfuryl acrylate, phenyl acrylate, hydroxyphenyl acrylate, chlorophenyl acrylate, sulfamoylphenyl acrylate, 2-(hydroxyphenylcarbonyloxy)ethyl acrylate, and the like.

Specific examples of the methacrylates include methyl methacrylate, ethyl methacrylate, (n- or i-)propyl methacrylate, (n-, i-, sec- or t-)butyl methacylate, amyl methacrylate, 2-ethylhexyl methacrylate, dodecyl methacrylate, chloroethyl methacrylate, 2-hydroxyethyl methacrylate, 2-hydroxypropyl methacrylate, 5-hydroxypentyl methacrylate, cyclohexyl methacrylate, allyl methacrylate, trimethylolpropane monomethacrylate, pentaerythritol monomethacrylate, glycidyl methacrylate, benzyl methacrylate, methoxybenzyl methacrylate, chlorobenzyl methacrylate, hydroxybenzyl methacrylate, hydroxyphenethyl methacrylate, dihydroxyphenethyl methacrylate, furfuryl methacrylate, tetrahydrofurfuryl methacrylate, phenyl methacrylate, hydroxyphenyl methacrylate, chlorophenyl methacrylate, sulfamoylphenyl methacrylate, 2-(hydroxyphenylcarbonyloxy)ethyl methacrylate, and the like.

Specific examples of the acrylamides include acrylamide, N-methylacrylamide, N-ethylacrylamide, N-propylacrylamide, N-butylacrylamide, N-benzylacrylamide, N-hydroxyethylacrylamide, N-phenylacrylamide, N-tolylacrylamide, N-(hydroxyphenyl)acrylamide, N-(sulfamoylphenyl) acrylamide, N-(phenylsulfonyl)acrylamide, N-(tolylsulfonyl)acrylamide, N,N-dimethylacrylamide, N-methyl-N-phenylacrylamide, N-hydroxyethyl-N-methylacrylamide, and the like.

Specific examples of the methacrylamides include methacrylamide, N-methylmethacrylamide, N-ethylmethacrylamide, N-propylmethacrylamide, N-butylmethacrylamide, N-benzylmethacrylamide, N-hydroxyethylmethacrylamide, N-phenylmethacrylamide, N-tolylmethacrylamide, N-(hydroxyphenyl) methacrylamide, N-(sulfamoylphenyl)methacrylamide, N-(phenylsulfonyl)methacrylamide, N-(tolylsulfonyl) methacrylamide, N,N-dimethylmethacrylamide, N-methyl-N-phenylmethacrylamide, N-hydroxyethyl-N-methylmethacrylamide, and the like.

Specific examples of the vinyl esters include vinyl acetate, vinyl butyrate, vinyl benzoate, and the like.

Specific examples of the styrenes include styrene, methylstyrene, dimethylstyrene, trimethylstyrene, ethylstyrene, propylstyrene, cyclohexylstyrene, chloromethylstyrene, trifluoromethylstyrene, ethoxymethylstyrene, acetoxymethylstyrene, methoxystyrene, dimethoxystyrene, chlorostyrene, dichlorostyrene, bromostyrene, iodostyrene, fluorostyrene, carboxystyrene, and the like.

As the other monomers, there may be used where necessary monomers having cross-liking reactivity such as glycidyl methacrylate, N-methylolmethacrylamide, ω-(trimethoxysilyl)propyl methacrylate, 2-isocyanate ethyl acrylate and the like.

Among these other monomers, particularly suitably used are acrylates, methacrylates, acrylamides, methacrylamides, vinyl esters, styrenes acrylic acid, methacrylic acid, and acrylonitrile having not more than 20 carbon atoms.

The proportion of these other monomers used for synthesizing a copolymer is required to be an amount sufficient for improving the various physical properties, however, when the proportion is too high, the function of the partial structure of the general formula (1) is insufficient. Therefore, the total proportion of preferable other monomers is preferably 80% by weight or less, and more preferably 50% by weight or less.

Specific examples of the sulfonic acid generating polymer in the present invention will be described below.

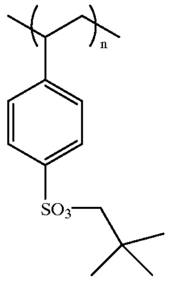
(1p-1)

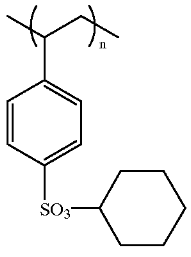
(1p-2)

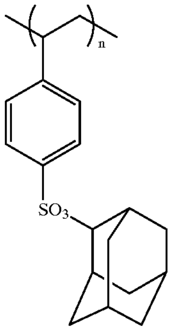
(1p-3)

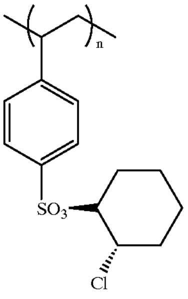
(1p-4)

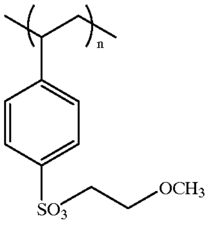
(1p-5)

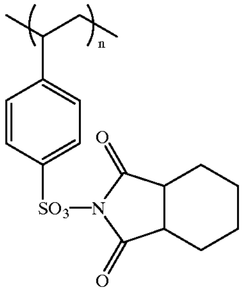
(1p-6)

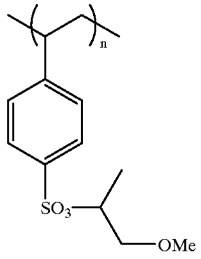
(1p-7)

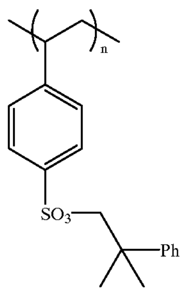
(1p-8)

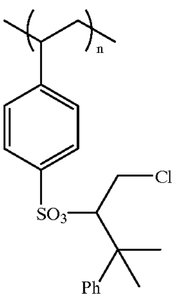
(1p-9)

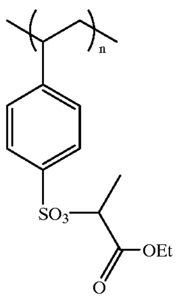
(1p-10)

-continued
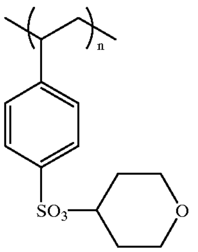
(1p-11)
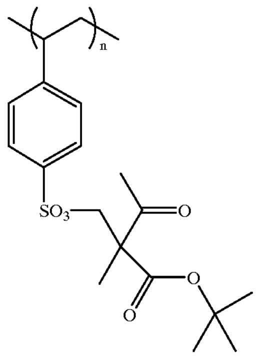
(1p-12)
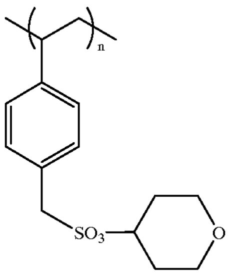
(1p-13)
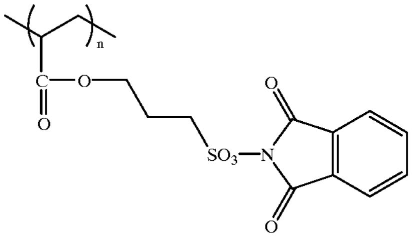
(1p-14)
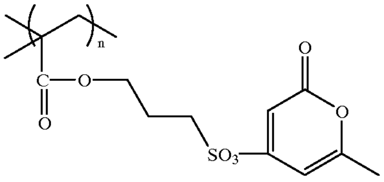
(1p-15)
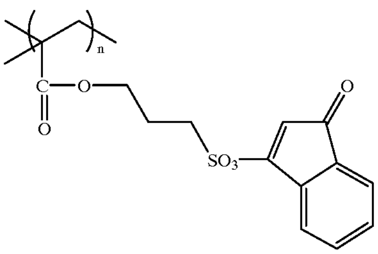
(1p-16)
-continued
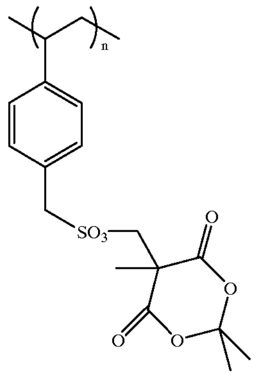
(1p-17)
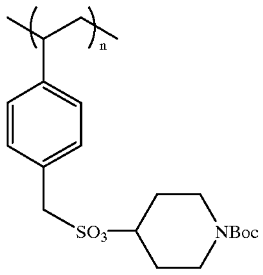
(1p-18)
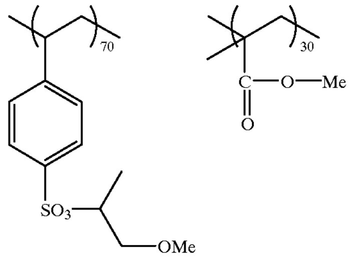
(1p-20)
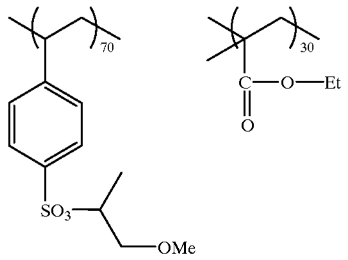
(1p-21)
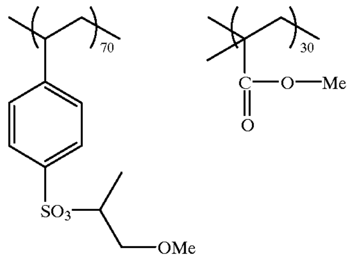
(1p-20)
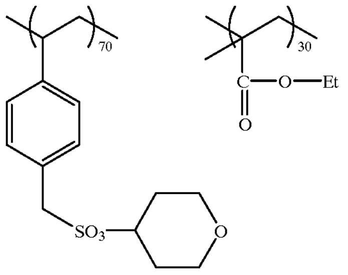
(1p-21)

-continued

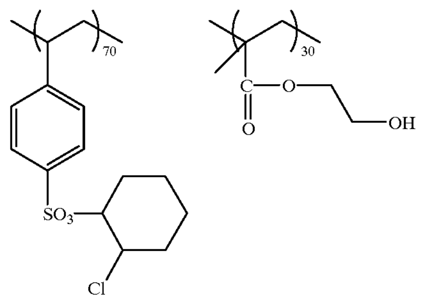

(1p-22)

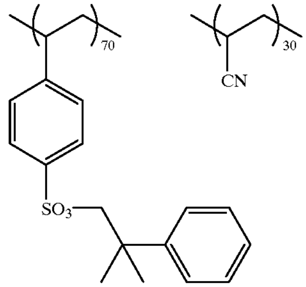

(1p-23)

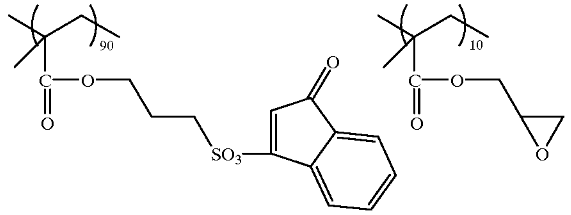

(1p-24)

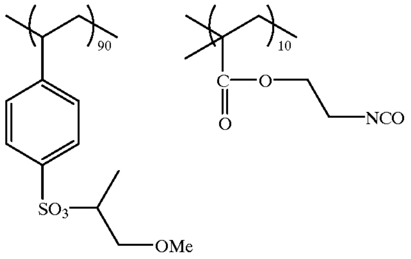

(1p-25)

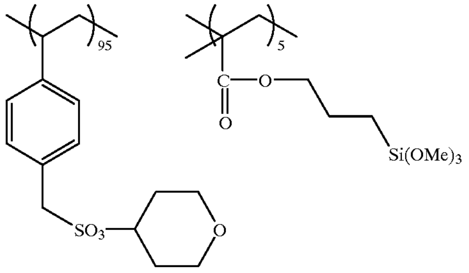

(1p-26)

-continued

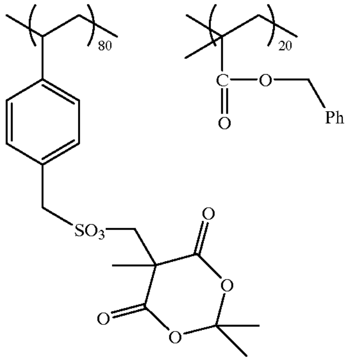

(1p-27)

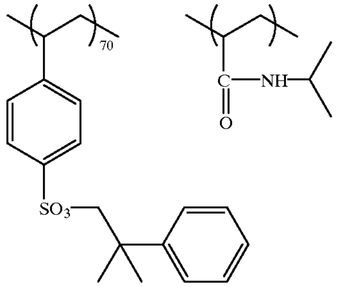

(1p-28)

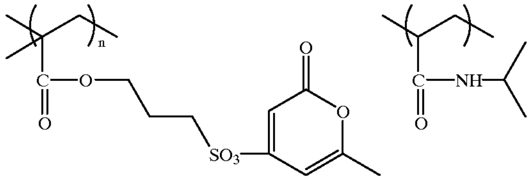

(1p-30)

The numbers in the formulae represent molar composition of the polymer compound.

Examples of solvents used in synthesizing the sulfonic acid generating polymer used in the present invention include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethylsulfoxide, water, and the like. These solvents are used alone or in combination of two or more.

As the polymerization initiator used in synthesizing the sulfonic acid generating polymer used in the present invention by radical polymerization, known compounds such as azo-based initiators, peroxide initiators and the like can be used.

The sulfonic acid generating polymer used in the present invention can be easily synthesized by methods known to those skilled in the art as described above. The polymerizable monomer is synthesized, for example, by de-hydrochlorination condensation of sulfonyl chloride with alcohol. Synthesis of the polymer can be carried out by the general procedure described above. A more specific synthesis method for the sulfonic acid generating polymer in the present invention is disclosed, for example, in Japanese Patent Application No. 9-026878.

Next, the polymer which generates a carboxylic acid in the side chain by heating, which is another example of the components of the layer (b) used in the present invention, will be described in detail below. As such a carboxylate polymer, for example, those described in JP-B No. 2-27660, JP-A Nos. 5-181279, 6-83059, 6-282073, European Patent Application No. 366590 and the like are listed.

As specific examples of the preferable carboxylic acid generating polymer, polymers are listed having in the side chain a group represented by the following general formulae (4) and (5).

(4)

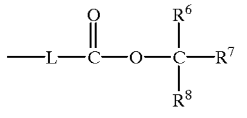

(5)

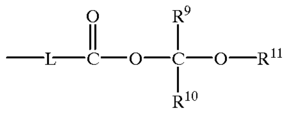

In the formulae (4) and (5), L represents an organic group composed of a polyvalent non-metal atom necessary for connecting a substituent to a polymer main chain. The substituent herein referred to is a carboxylate. $R^6$ to $R^{10}$ may be the same or different, and represent a hydrogen atom, or an alkyl group, alkenyl group, acyl group or alkoxycarbonyl group which may have a substituent, and $R^{11}$ represents an alkyl group or alkenyl group which may have a substituent. Further, two of $R^6$ to $R^8$ or two of $R^9$ to $R^{11}$ may be connected to form a ring structure composed of 3 to 8 carbon atoms or hetero atoms.

Preferable examples of the alkyl group in which $R^6$ to $R^{10}$ may have a substituent include those having 1 to 8 carbon atoms which may have a substituent, such as a methyl group, ethyl group, propyl group, n-butyl group, sec-butyl group, hexyl group, 2-ethylhexyl group, and octyl group. Preferable examples when the alkyl group is a cycloalkyl group include those having 3 to 8 carbon atoms which may have a substituent, such as a cyclopropyl group, cyclopentyl group and cyclohexyl group. Preferable examples of the alkenyl group which may have a substituent include those having 2 to 6 carbon atoms which may have a substituent, such as a vinyl group, propenyl group, allyl group, butenyl group, pentenyl group, hexenyl group and cyclohexenyl group. Preferable examples of the acyl group which may have a substituent include those having 1 to 10 carbon atoms which may have a substituent, such as a formyl group, acetyl group, propanoyl group, butanoyl group, octanoyl group and the like. Preferable examples of the alkoxycarbonyl group which may have a substituent include those having 2 to 8 carbon atoms which may have a substituent, such as a methoxycarbonyl group, butoxycarbonyl group and the like.

Preferable examples when $R^{11}$ is an alkyl group and preferable examples when $R^{11}$ is an alkenyl group are the same as those for $R^6$ to $R^{10}$.

When $R^6$ to $R^{10}$ and $R^{11}$ further have a substituent, preferable examples of the substituent include a hydroxyl group, halogen atoms (—F, —Cl, —Br, —I), a nitro group, cyano group, amide group, sulfonamide group, and further, alkoxy groups having 1 to 8 carbon atoms such as a methoxy group, ethoxy group, propoxy group, butoxy group and the like, and the alkyl groups, alkoxycarbonyl groups, acyl groups and cycloalkyl groups exemplified for $R^6$ to $R^{10}$. When any two of $R^6$ to $R^{10}$ and $R^{11}$ on the same carbon atom are connected each other to form a ring, there are listed 3 to 8-membered rings which may have a hetero atom such as a cyclopropyl group, cyclopentyl group, cyclohexyl group, cycloheptyl group, tetrahydrofuranyl group, tetrahydropyranyl group and the like as the preferable ring. These may further have the above-described substituent.

L connects a polymer main chain with a carboxylate in a carboxylic acid generating polymer. Other conditions thereof are the same as those for L in the general formulae (1) to (3).

Among the polymers having a group represented by the general formulae (4) to (5), particularly preferable are polymers having at least one of the repeating units represented by the following formulae (7) to (12).

(7)

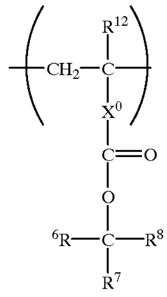

(8)

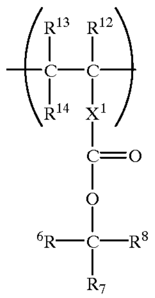

(9)

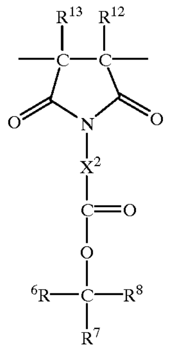

-continued (10)

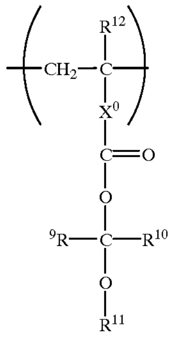

(11)

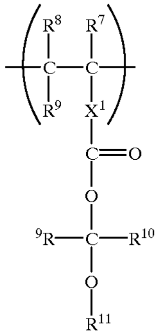

(12)

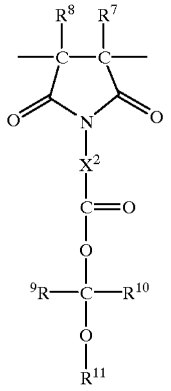

In the formulae (7) to (12), $R^{12}$ and $R^{13}$ may be the same or different and represent a hydrogen atom, cyano group, alkyl group or haloalkyl group, $R^{14}$ represents a cyano group, —CO—OR$^{15}$ or —CONR$^{16}$R$^{7}$. $R^{15}$ to $R^{17}$ may be the same or different and represent a hydrogen atom, and an alkyl group, cycloalkyl group or alkenyl group which may have a substituent. $R^{16}$ and $R^{17}$ may be connected to each other to form a ring. $X^0$ to $X^2$ may be the same or different, and represent a single bond, or an alkylene group, alkenylene group or cycloalkenylene group which may have a substituent, —O—, —$SO_2$—, —O—CO—R$^{18}$—, —CO—O—R$^{19}$— or —CO—NR$^{20}$—R$^{21}$—. $R^{18}$, $R^{19}$ and $R^{21}$ may be the same or different, and represent a single bond, or a divalent alkylene group, alkenylene group or cycloalkylene group, and these groups may further form a divalent group together with an ether group, ester group, amide group, urethane group or ureide group. $R^{20}$ may represent a hydrogen, or an alkyl group, cycloalkyl group or alkenyl group which may have a substituent. $R^6$ to $R^{11}$ have the same definitions as for the above-described general formulae (4) and (5).

As the alkyl groups $R^{12}$ and $R^{13}$, there are listed those having 1 to 4 carbon atoms which may have a substituent such as a methyl group, ethyl group, propyl group, n-butyl group and sec-butyl group. As the haloalkyl groups, there are preferably listed alkyl groups having 1 to 4 carbon atoms and substituted by a fluorine atom, chlorine atom or bromine atom, for example, a fluoromethyl group, chloromethyl group, bromomethyl group, fluoroethyl group, chloroethyl group, bromoethyl group and the like.

$R^{14}$ represents a cyano group, —CO—OR$^{15}$ or —CONR$^{16}$R$^{17}$. As the alkyl groups $R^{15}$ to $R^{17}$, there are listed those having 1 to 4 carbon atoms which may have a substituent, such as a methyl group, ethyl group, propyl group, n-butyl group and sec-butyl group. As the cycloalkyl group, there are preferably listed those having 3 to 8 carbon atoms which may have a substituent, such as a cyclopropyl group, cyclopentyl group and cyclohexyl group. As the alkenyl group, there are listed those having 2 to 6 carbon atoms which may have a substituent, such as a vinyl group, propenyl group, allyl group, butenyl group, pentenyl group, hexenyl group and cyclohexenyl group.

$X^0$ to $X^2$ maybe the same or different, and represent a single bond, or an alkylene group, alkenylene group or cycloalkenylene group which may have a substituent, —O—, —$SO_2$—, —O—CO—R$^{18}$—, —CO—O—R$^{19}$— or —CO—NR$^{20}$—R$^{21}$—. The alkylene groups $X^0$ to $X^2$ may preferably have a substituent. For example, those having 1 to 8 carbon atoms are listed, such as a methylene group, ethylene group, propylene group, butylene group, hexylene group, octylene group and the like. As the alkenylene group, there are preferably listed those having 2 to 6 carbon atoms which may have a substituent, such as an ethenylene group, propenylene group, butenylene group and the like. As the cycloalkylene group, there are preferably listed those having 5 to 8 carbon atoms which may have a substituent, such as a cyclopentylene group, cyclohexylene group and the like. As the alkyl group $R^{20}$, there are listed those having 1 to 4 carbon atoms which may have a substituent, such as a methyl, ethyl group, propyl group, n-butyl group and sec-butyl group. As the cycloalkyl group, there are listed those having 3 to 8 carbon atoms which may have a substituent, such as a cyclopropyl group, cyclopentyl group and cyclohexyl group. As the alkenyl group, there are preferably listed those having 2 to 6 carbon atoms which may have a substituent, such as a vinyl group, propenyl group, allyl group, butenyl group, pentenyl group, hexenyl group and cyclohexenyl group. The alkylene groups, alkenyl groups and cycloalkylene groups $R^{18}$, $R^{19}$ and $R^{21}$ include those exemplified above, and further, divalent groups formed by connecting those groups with at least one of ether groups, ester groups, amide groups, urethane groups and ureide groups.

When $R^{12}$ to $R^{21}$ and $X^0$ to $X^2$ have a substituent, the substituent preferably is an alkyl group having 1 to 4 carbon atoms such as a methyl group, ethyl group, propyl group and the like, hydroxyl group, nitro group, further, an alkoky group having 1 to 8 carbon atoms such as a methoxy group, ethoxy group, propoxy group, butoxy group or the like.

The carboxylic acid generating polymer can be produced by conventionally known various polymerization methods such as radical polymerization, ion polymerization, polycondensation and the like, in the same manner as the sulfonic acid generating polymer monomers having a group represented by the formulae (4) to (5) may be polymerized alone or two or more of them may be copolymerized. Further, monomers having a group represented by the formulae (4) to (5) may be copolymerized with the other monomer exemplified for the sulfonic acid generating polymer.

Specific examples of repeating structural units represented by the general formulae (7) to (12) include, but are not limited to, the following units (a1) to (a30).
(a1)
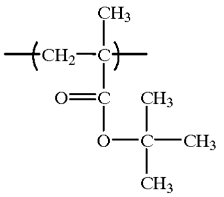
(a2)
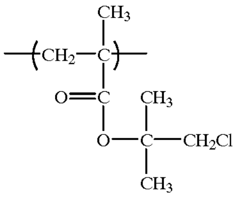
(a3)
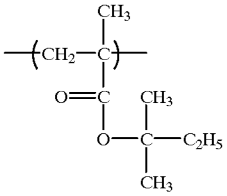
(a4)
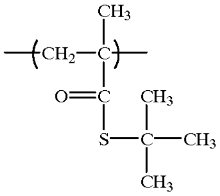
(a5)
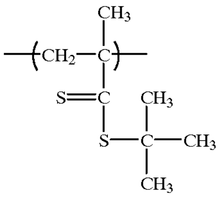
(a6)
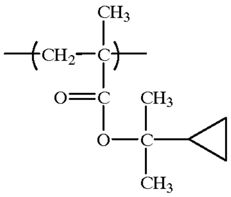
(a7)
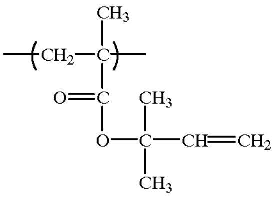
-continued
(a8)
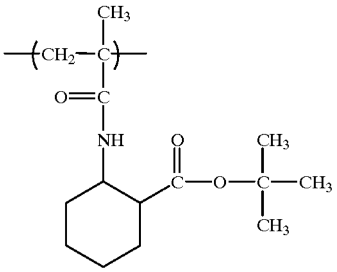
(a9)
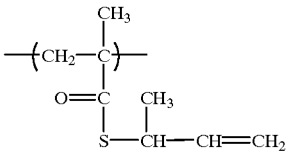
(a10)
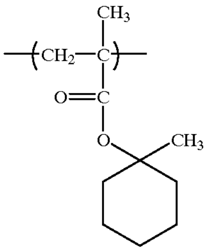
(a11)
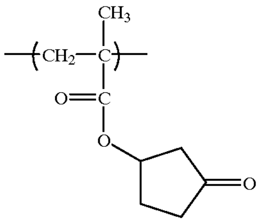
(a12)
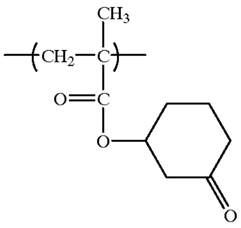
(a13)
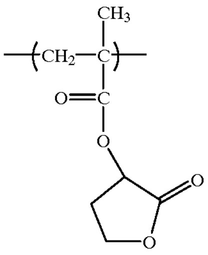

-continued
(a14)
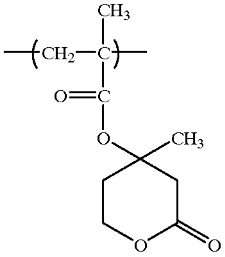
(a15)
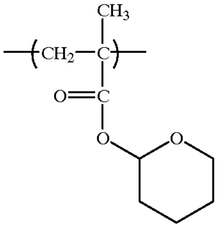
(a16)
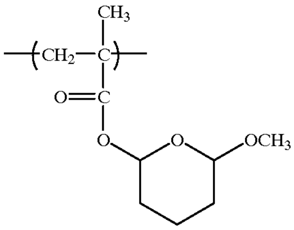
(a17)
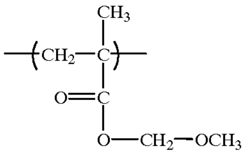
(a18)
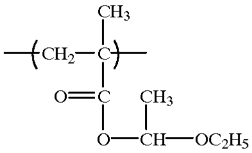
(a19)
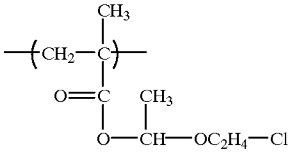
(a20)
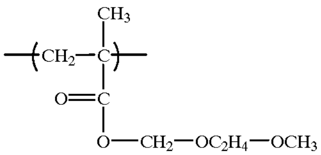
-continued
(a21)
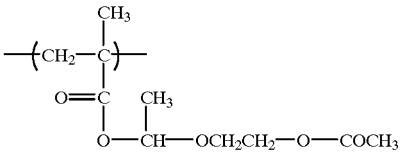
(a22)
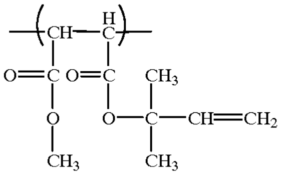
(a23)
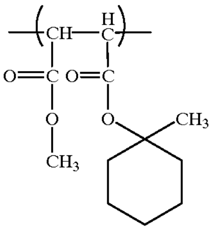
(a24)
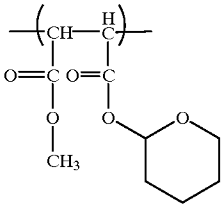
(a25)
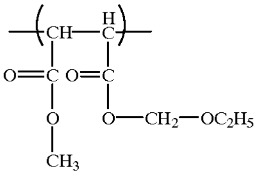
(a26)
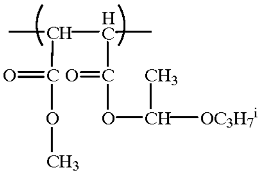
(a27)
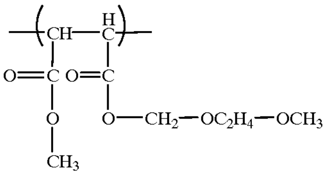

-continued (a28)

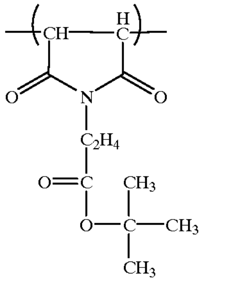

(a29)

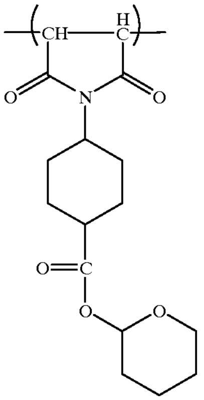

(a30)

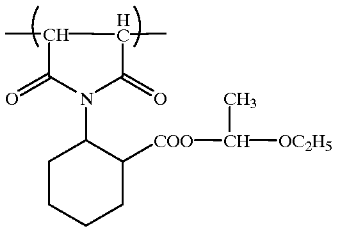

Among above-described carboxylate polymers, those of an alkoxymethyl ester type represented by the structural unit (5) are particularly suitable due to their extremely excellent heat sensitivity.

The polymer having at least one of groups represented by the above-described formulae (1) to (5) used in the present invention has a weight average molecular weight of preferably $2.0\times10^3$ or more, and more preferably in the range from $5.0\times10^3$ to $3.0\times10^5$. The number-average molecular weight is preferably $8.0\times10^2$ or more, and further preferably in the range from $1.0\times10^3$ to $2.5\times10^5$. The polydispersibility (weight-average molecular weight/number-average molecular weight) is preferably 1 or more, and more preferably in the range from 1.1 to 10.

These polymer compounds may be in the form of a random polymer, block polymer, graft polymer and the like, and preferably random polymers.

The sulfonic acid generating polymer or carboxylic acid generating polymer used in the present invention may be used alone or in combination. The sulfonic acid generating polymer or carboxylic acid generating polymer can be used in a proportion from 20 to 100% by weight, and preferably from 50 to 100% by weight based on the total weight of solid components in the heat sensitive layer. If the amount added is less than 20% by weight, sufficient high sensitization may not sometimes be attained.

The layer (b) in the present invention may contain other additives added optionally. For example, the addition of a heat acid generator is preferable in that heat sensitivity is enhanced since decomposition into a sulfonic acid or carboxylic acid is promoted. In the present invention, the heat source which makes layer (b) hydrophilic is layer (c) which can be removed by heat mode, however, depending on occasions, it is possible to add also to a heat sensitive layer a light absorbing agent to act as a supplement for converting irradiated light to heat, for example, an infrared ray absorbing agent may be added when the light source is infrared laser. However, if the amount added thereof is too large, efficient hydrophilization near the substrate which is the effect of the present invention is lost. When an absorbing agent is added, it is preferable that absorbance in relation to the exposure light source is about 0.5 or less.

The heat acid generator added to the layer (b) is one which becomes, after being decomposed by heat, a strong acid which can promote the above-described conversion of a carboxylate to a carboxylic acid or conversion of a sulfonate to a sulfonic acid. An agent which generates by heat decomposition a strong acid manifesting a pKa in water preferably of 4 or less, and more preferably of 2.5 or less is advantageous. For example, any of the groups of compounds usually used as a light acid generator can be used, and in addition, there can be used alkyl esters of organic oxy acids having a pKa of 4 or less, and preferably 3 or less, such as sulfonic acid, phosphoric acid, phosphorous acid, phosphonic acid, boric acid and the like. Use of a heat acid generator having a weight loss temperature (decomposition temperature) calculated by TG/DTA is from 80 to 300° C. is preferable from the viewpoint of storagability and heat decomposability, and more preferably, the weight loss temperature is from 110 to 200° C.

Examples of the compound which generate an acid by heating include, but are not limited to, the following groups of compound. Diazonium salts described in S. I. Schlesinger, Photogr. Sci. Eng., 18, 387 (1974), T. S. Bal et al., Polymer, 21, 423 (1980) and the like, ammonium salts described in U.S. Pat. Nos. 4,069,055, 4,069,056, JP-A No. 3-140,140 and the like, phosphonium salts described in D. C. Necker et al., Macromolecules, 17, 2468 (1984), C. S. Wen et al., Tech, Proc. Conf. Rad. Curing ASIA, p478, Tokyo, October (1988), U.S. Pat. Nos. 4,069,055, 4,069,056 and the like, iodonium salts described in J. V. Crivello et al., Macromolecules, 10 (6), 1307 (1977), Chem. & Eng. News, November 28, p31 (1988), European Patent Application No. 104,143, U.S. Pat. No. 4,837,124, JP-A Nos. 2-150,848, 2-296,514 and the like, sulfonium salts described in J. V. Crivello et al., Polymer J. 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromorecules, 14 (5), 1141 (1981), J. V. Crivello et al., J. Polymer Sci., Polymer Chem. Ed., 17, 2877 (1979), European Patent Application No. 370, 693, U.S. Pat. No. 3,902, 114, European Patent Application Nos. 233,567, 297,443, 297,442, 422,570, 279,210, U.S. Pat. Nos. 4,933,377, 4,760, 013, 4,734,444, 2,833,827, DE Pat. Nos. 2,904,626, 3,604, 580, 3,604,581 and the like, selenonium salts described in J. V. Crivello et al., Macromolecules, 10 (6), 1307 (1977), J. V. Crivello et al., J. Polymer Sci., Polymer Chem. Ed., 17, 1047 (1979) and the like, onium salts such as an arsonium salt and the like described in C. S. Wen et al., Tech, Proc. Conf. Rad. Curing ASIA, p478, Tokyo, October (1988) and the like, organic halogen compounds described in U.S. Pat. No. 3,905,815, JP-B No. 46-4,605, JP-A Nos. 48-36,281, 55-32, 070, 60-239,736, 61-169,835, 61-169,837, 62-58,241, 62-212,401, 63-70,243, 63-298,339 and the like, organometal/organic halogen compounds described in K. Meier et al., J. Rad. Curing, 13 (4), 26 (1986) T. P. Gill et al., Inorg. Chem., 19, 3007 (1980), D. Astruc, Acc. Chem. Res., 19 (12), 377 (1896), JP-A No. 2-161,445 and the like, photo acid-generating agents having an O-nitrobenzyl type protecting group described in S. Hayase et al., J. Polymer Sci., 25, 753 (1987), E. Reichmanis et al., J. Polymer Sci., Polymer Chem. Ed., 23, 1 (1985), Q. Q. Zhu et al., J. Photochem., 36, 85, 39, 317 (1987), B. Amit et al., Tetrahedron Lett., (24) 2205 (1973), D. H. R. Barton et al., J. Chem. Soc., 3571 (1965), P. M. Collins et al., J. Chem. Soc., Perkin I, 1965 (1975), M. Rudinstein et al., Tetrahedron Lett., (17) , 1445 (1975), J. W. Walker et al., J. Am. Chem. Soc., 110, 7170 (1988), S. C. Busman et al., J. Imaging Technol., 11 (4), 191 (1985), H. M. Houlihan et al., Macromolecules, 21, 2001 (1988), P. M. Collins et al., J. Chem. Soc., Chem. Commun., 532 (1972), S. Hayase et al., Macromolecules, 18, 1799 (1985), E. Reichmanis et al., J. Electrochem. Soc., Solid State Sci. Technol., 130 (6), F. M. Houlihan et al., Macromolecules, 21, 2001 (1988), European Patent Application Nos. 0,290,750, 046,083, 156,535, 271, 851, 0,388,343, U.S. Pat. Nos. 3,901,710, 4,181,531, JP-A Nos. 60-198,538, 53-133,022 and the like, compounds which are photo-decomposed to generate sulfonic acid represented by iminosulfonate and the like described in M. TUNOOKA et al., Polymer Preprints Japan, 35 (8), G. Berner et al., J. Rad. Curing, 13 (4), W. J. Mijs et al., Coating Technol., 55 (697), 45 (1983), Akzo, H. Adachi et al., Polymer Preprints, Japan, 37 (3), European Patent Application Nos. 0,199,672, 84,515, 199,672, 044,115, 0,101,122, U.S. Pat. Nos. 4,618,564, 4,371,605, 4,431,774, JP-A Nos. 64-18,143, 2-245,756, 4-365,048 and the like, disulfone compounds described in JP-A No. 61-166,544, o-naphthoquinone diazide-4-sulfonic halides described in JP-A No. 50-36, 209 (U.S. Pat. No. 3,969,118), o-naphthoquinone diazide compounds described in JP-A No. 55-62,444 (U.K. Patent No. 2,038,801) and JP-B No. 1-11, 935.

In addition to these additives, sulfonates which generate an acid by heat described in Japanese Patent Application Nos. 9-26878, 9-89451, and 9-85328 can be used.

When infrared ray absorbing agents are added to layer (b), the infrared ray absorbing agents are a dye or pigment effectively absorbing an infrared ray having a wavelength of 760 nm to 1,200 nm. It is preferable that the dye or pigment has an absorption maximum between the wavelengths of 760 nm and 1,200 nm.

As dyes, known dyes commercially available or those disclosed in the literature (such as "Senryo Binran (Dye Handbook)" edited by Yuki Gosei Kagaku Kyokai (Organic Synthetic Chemistry Association), published in 1970), can be used. Specifically, examples may include azo dyes, metal complex azo dyes, pyrazolone azo dyes, anthraquinone dyes, phthalocyanine dyes, carbonium dyes, quinoneimine dyes, methyne dyes, cyanine dyes, and metal thiolate complexes.

Examples of preferable dyes may include cyanine dyes disclosed in JP-A Nos. 58-125,246, 59-84,356, 59-202,829, and 60-78,787; methyne dyes disclosed in JP-A Nos. 58-173,696, 58-181,690, and 58-194,595; naphthoquinone dyes disclosed in JP-A Nos. 58-112,793, 58-224,793, 59-48, 187, 59-73,996, 60-52,940, and 60-63,744; squarylium dyes disclosed in JP-A No. 58-112,792; and cyanine dyes disclosed in U.K. Patent No. 434,875.

Furthermore, near infrared absorption sensitizing agents disclosed in U.S. Pat. No. 5,156,938 can be preferably used. Moreover, substituted aryl benzo(thio)pyrylium salts disclosed in U.S. Pat. No. 3,881,924; trimethyne thiapyrylium salts disclosed in JP-A No. 57-142,645 (U.S. Pat. No. 4,327,169); pyrylium-containing compounds disclosed in JP-A Nos. 58-181,051, 58-220,143, 59-41,363, 59-84,248, 59-84,249, 59-146,063, and 59-146,061; cyanine dyes disclosed in JP-A No. 59-216,146; pentamethyne thiopyrylium salts disclosed in U.S. Pat. No. 4,283,475; and pyrylium compounds disclosed in JP-B Nos. 5-13,514 and 5-19,702 can be preferably used as well.

As other examples of preferable dyes, near infrared absorption dyes disclosed in U.S. Pat. No. 4,756,993 represented by formulas (I) and (II) can be presented.

Among these dyes, particularly preferable are cyanine dyes, squarylium dyes, pyrylium salts, and nickel thiolate complexes.

Pigments usable in the present invention may include commercially available pigments and those disclosed in the Color Index (C. I.) Manual, "Saishin Ganryo Binran (Modern Pigment Manual)" edited by Nippon Ganryo Gijutsu Kyokai (Japan Pigment Technology Association), published in 1977; "Saishin Ganryo Oyo Gijutsu (Modern Pigment Application Technology)" by CMC Press, published in 1986; and "Insatsu Ink Gijutsu (Printing Ink Technology)" by CMC Press, published in 1984.

Examples of pigments may include black pigments, yellow pigments, orange pigments, brown pigments, red pigments, purple pigments, blue pigments, green pigments, fluorescent pigments, metal powder pigments, and polymer bond pigments. Specifically, insoluble azo pigments, azo lake pigments, condensation azo pigments, chelate azo pigment, phthalocyanine pigments, anthraquinone pigments, perylene and perynone pigments, thioindigo pigments, quinacridone pigments, dioxazine pigments, isoindolinone pigments, quinophthalone pigments, colored lake pigments, azine pigments, nitroso pigments, nitro pigments, natural pigments, fluorescent pigments, inorganic pigments, and carbon black can be used. Among these examples, carbon black is preferable.

These pigments can be used without surface treatment, or can be used after the application of a surface treatment. Examples of surface treatment methods may include a method of surface coating with a resin or a wax, a method of adhering a surfactant thereto, anda method of bonding a reactive substance (such as a silane coupling agent, an epoxy compound, or a polyisocyanate) with the pigment surface. The above-mentioned surface treatment methods are disclosed in "Kinzokusekken no Seishitsu to Oyo (Natures and Applications of Metal Soaps)" by Sachi Press; "Insatsu Ink Gijutsu (Printing Ink Technology)" by CMC Press; published in 1984; and "Saishin Ganryo Oyo Gijutsu (Modern Pigment Application Technology)" by CMC Press, published in 1986.

A pigment particle size of 0.01 $\mu$m to 10 $\mu$m is preferable, 0.05 $\mu$m to 1 $\mu$m is more preferable, and 0.1 $\mu$m to 1 $\mu$m is the most preferable. A pigment particle size smaller than 0.01 $\mu$m is not preferable in terms of the stability of the pigment dispersion in a photosensitive layer coating solution. On the other hand, a pigment particle size larger than 10 $\mu$m is not preferable in terms of the uniformity of the image recording layer.

As methods of dispersing a pigment, known dispersing methods employed in ink production or toner production can be used. Examples of the dispersing machine include ultrasonic dispersing machines, sand mills, attritors, pearl mills, super mills, ball mills, impellers, dispersers, KD mills, colloid mills, dynatrons, triple roll mills, and pressure kneaders. Details thereof are described in "Saishin Ganryo Oyo Gijutsu (Modern Pigment Application Technology)" by CMC Press, published in 1986.

These dyes or pigments can be added to an image recording material in an amount of 0.01 to 50% by weight based on the weight of the total solid component of the image recording material, preferably in an amount of 0.1 to 10% by weight, and more preferably in an amount of 0.5 to 10% by weight in the case of a dye, and more preferably in an amount of 3.1 to 10% by weight in the case of a pigment. An amount of a pigment or dye less than 0,01% by weight causes low sensitivity. On the other hand, an amount more than 50% by weight produces stains in nonimage portions at the time of printing.

In the present invention, other additives may further be added to layer (b) according to necessity. For example, a dye having a large absorption in the visible light region can be added as a coloring agent. Specifically, examples may include Oil Yellow #101, Oil Yellow #103, Oil Pink #312, Oil Green BG, Oil Blue BOS, Oil Blue #603, Oil Black BY, Oil Black BS, Oil Black T-505 (manufactured by Orient Chemical Industry, Co., Ltd.), Victoria Pure Blue, Crystal Violet (CI42555), Methyl Violet (CI42535), Ethyl Violet, Rhodamine B (CI145170B), Malachite Green (CI42000) , Methylene Blue (CI52015), and dyes disclosed in JP-A No.62-293,247.

In order to guarantee stable treatment regardless of fluctuations in the printing conditions, a nonionic surfactant disclosed in JP-A Nos. 62-251,740 and 3-208,514 and an ampholytic surfactant disclosed in JP-A Nos. 59-121,044 and 4-13,149 can be added to layer (b) of the present invention.

Examples of nonionic surfactants may include sorbitan tristearate, sorbitan monopalmitate, sorbitan triolate, mono glyceride stearate, and polyoxyethylene nonylphenyl ether.

Examples of ampholytic surfactants may include alkyl di(aminoethyl)glycine, alkyl polyaminoethylglycine hydrochloride, 2-alkyl-N-carboxyethyl-N-hydroxyethyl imidazolinium betaine, and N-tetradecyl-N,N-substituted betaine (for example, Amorgen K manufactured by Dai-Ichi Kogyo Co., Ltd.).

The amount of the above-described nonionic surfactants and ampholytic surfactants is preferably from 0.05 to 15 % by weight, and more preferably from 0.1 to 5% by weight in an image recording material.

In order to provide flexibility to the film, etc., a plasticizer can be added as needed to layer (b) of the present invention. Examples of a plasticizer may include polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, an oligomer and a polymer of acrylic acid or methacrylic acid.

In addition to these examples, epoxy compounds, vinyl ethers, phenol compounds having an alkoxy methyl group and phenol compounds having a hydroxymethyl group disclosed in Japanese Patent Application No. 7-18,120, can also be added. Other polymer compounds can be added in order to increase the strength of the film.

The planographic printing plate of the present invention can be produced, in general, by dissolving the above-described component in a solvent and applying the resultant solution to an appropriate support. Solvents used herein may include, but are not limited to, ethylene dichloride, cyclohexanone, methyl ethyl ketone, methanol, ethanol, propanol, ethylene glycol monomethyl ether, 1-methoxy-2-propanol, 2-methoxy ethyl acetate, 1-methoxy-2-propyl acetate, dimethoxyethane, methyl lactate, ethyl lactate, N,N-dimethyl acetamide, N,N-dimethyl formamide, tetramethyl urea, N-methyl pyrrolidone, dimethyl sulfoxide, sulfolane, γ-butyrolactone, toluene and water.

These solvents are used alone or in combinations thereof. The concentration of the above-described components (total solid component including additives) is preferably from 1 to 50% by weight in the solution.

A surfactant for improving the applicability, such as a fluorine-containing surfactant disclosed in JP-A No. 62-170,950 can be added to layer (b) of the present invention. The amount added is preferably from 0.01 to 1% by weight based on the total solid component of the image recording material, and more preferably from 0.05 to 0.5% by weight.

The amount coated of layer (b) obtained after coating and drying (solid component) differs depending on use, and in the case of the printing plate precursor (1), 0.5 to 5.0 $g/m^2$ is preferable and 0.5 to 1.5 $g/m^2$ is more preferable. In the present invention since layer (b) is coated after the formation of layer (a) and both of them are partially compatibilized at the interface, adhesion between hydrophilic layer (a) and hydrophobic layer (b) becomes excellent and releasing between the layers is effectively prevented.

The amount coated of layer (b) (solid component) in the printing plate precursors (2) and (3) differs depending on the overall structure of the printing plate precursor, and in general, is preferably 2.0 $g/m^2$ or less, and more preferably 1.0 $g/m^2$ or less. For conducting coating, various methods can be used, and for example, bar coater coating, rotation coating, spray coating, curtain coating, dip coating, air knife coating, blade coating, roll coating, and the like are listed.

Layer (c)

In the present invention, the phrase "removal by heat mode exposure" neither means that all recording layer components disappear in the stage of irradiation in the irradiation range nor means that substantial reduction in weight necessarily accompanies the irradiation stage. The phenomenon caused by the irradiation is characterized in that form change in the form of the recording layer solid follows, and it means that the structure of the layer is substantially decomposed. Scientifically, phenomena such as ablation, evaporation, melting and the like are included, and these are not necessarily accompanied by a reduction in weight. However, such a form change in the present invention is required to cause at least partial removal of irradiation portions in the intermediate layer, in some cases in the irradiation stage, and in other cases in post treatment or printing process. Such form change can be recognized by various microscopic means, and the recording layer in the present invention is required to be able to cause at least such a form change.

Any hydrophilic solid thin layer or organic thin layer which can absorb-irradiated light can be suitably used in layer (c) in the planographic printing plate precursor of the present invention, and any known materials in this field, and the fields of metal processing, laser processing and the like can be used. The preferable layer (c) is generally one whose absorbance is as high as possible and whose thickness is as thin as possible, in view of the printing ability and image forming speed (sensitivity). When absorbance of irradiated light is low, the sensitivity decreases since the amount of heat generation due to light-to-heat conversion is low. When the film thickness is high, the sensitivity decreases because of the large amount of heat required for the removal or the removal becomes completely impossible, thereby causing blemishes in printing. The preferable absorbance is 0.1 or more, more preferably 0.5 or more, and most preferably 1.0 or more. The preferable thickness largely depends on the components of the layer (c) and when the layer (c) is an inorganic solid thin film (metal film and the like) described below, it is preferably 5000 Å or less, and more preferably 1000 Å or less, and in the case of an organic thin film, it is preferable that the amount coated is 500 $mg/m^2$ or less, and more preferably 100 $mg/m^2$ or less. The lower limit of the film thickness depends on absorbance, and the preferable thickness may advantageously be determined so that absorbance is 0.1 or more.

As the solid thin film, various inorganic solid thin films can be used described for example in JP-A Nos. 55-113307 and 52-37104. Specifically, for example, Mg, Sc, Y, Ti, Zr, Hf, V, Nb, Ta, Cr, Mo, W, Mn, Re, Fe, Co, Ni, Ru, Rh, Pd, Ir, Pt, Cu, Ag, Au, Zn, Cd, Al, Ga, In, Si, Ge, Pb, Sn, As, Sb, Bi, Se, Te, and the like are listed, and among these, Mg, Ti, Cr, Cu, Ag, Zn, Al, In, Sn, Bi, and Te are particularly advantageous in view of their sensitivity. In addition, there can be also used thin alloy films composed of compounds obtained by optionally changing the oxidation condition of the above-described metals (oxygen compounds, nitrogen compounds, and the like), stainless steel, brass and the like, chalcogen materials (S, Se simple substances, and the like), binary chalcogen materials (As—S system, As—Se system, As—Te system, S—Se system, Sb—Se system, Sb—Te system, Bi—S system, Bi—Se system, Bi—Te system, Ge—S system, Sn—S system, and the like), ternary chalcogen materials (As—S—Te system, As—Se—Te system, Ge—Sn—S system, and the like), graphite and the like, and further, inorganic thin films prepared by modifying these materials by oxidation, doping, and the like according to necessity can also be used. These thin films can be formed by usual methods such as dry methods such as vapor deposition (resistance heating, electron beam and the like), sputtering and ion plating on a substrate, and wet coating methods such as a method using electrochemical depositing, a sol gel method and the like, and in addition, the thin film can be formed for example, by a silver halide emulsion layer diffusion transfer developing method, however, the effect of the present invention is not limited by these film forming methods.

When an organic thin film is used as layer (c), the organic thin layer contains a suitable light absorbing agent. The organic thin film is usually constituted of a binder resin having film forming ability and a light absorbing agent, and optionally, a compound obtained by chemically binding these two components may also be used.

As the binder resin used in the organic thin film, those widely and generally known can be used without particular restriction. Specifically, novolak reins (phenol-formaldehyde resin, cresol-formaldehyde resin and the like), urea-formaldehyde resins, melamine-formaldehyde resins, alkyd resins, (meth)acrylic resins (polymethyl methacrylate, polyethyl acrylate and the like), styrene-based resins (polystyrene, α-methylpolystyrene and the like), polyamide-based resins (nylons), polyester resins, polyurethane-based resins, polyurea-based resins, polycarbonate resins, silicone-based resins, esters of polyvinylacetal (polyvinyl acetate and the like), acetals of polyvinyl alcohol (polyvinylburyral and the like), vinyl-based resin (polyvinyl chloride and the like), polyalkenes (polyethylene and the like), styrene-butadiene resins, polyvinylidene chlorides, fluorine-based resins, polyorganosiloxanes (polydimethylsiloxane and the like), organism polymer modified materials (polysaccharide, oligosaccharide, polypeptide and the like) and modified materials thereof (cellulose acetate, cellulose acetate butyrate and the like).

As the light absorbing agent used in the organic thin film, compounds which can absorb light energy radiation used for recording can be used without limitation. In the production of a printing plate using infrared laser which is a preferable embodiment of the present invention, it is desirable that the above-described light absorbing agent is an infrared absorbing agent. As examples of preferable infrared ray absorbing agents, those previously exemplified for the additive to layer (b) may be listed.

For producing the layer (c) when layer (c) is an organic thin film, the same methods used for the above-described layer (b) are listed. In general, layer (c) can be produced by dissolving components in a solvent and coating the mixture on a suitable substrate. Examples of the solvent herein used include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene, water and the like.

These solvents are used alone or in combination. The concentration of the above-described components (total solid components in layer (c) including additives) in the solvent is preferably from 1 to 50% by weight. The amount coated (solid components) on a substrate obtained after coating and drying is not particularly restricted, and in general, is preferably from 0.2 to 3.0 $g/m^2$. For conducting coating, various methods can be used, and for example, bar coater coating, rotation coating, spray coating, curtain coating, dip coating, air knife coating, blade coating, roll coating and the like are listed.

To the intermediate layer in the present invention, a surfactant for improving coatability, for example, fluorine-based surfactants as described in JP-A No. 62-170950 can be added. The amount added thereof is preferably from 0.01 to 1% by weight, and more preferably from 0.05 to 0.5% by weight based on the total weight of the solid components in the image recording material.

It is known that among the above-described general structures which cause form change by heat mode exposure and become substantially removable, use of specific materials and structure is advantageous from the viewpoint of recording sensitivity. Such known technology can be utilized also in the present invention without exception. For example, use or addition of a self-oxidizing resin such as nitrocellulose and the like described in JP-A No. 49-117102 (U.S. Pat. No. A86,656) and U.S. Pat. No. 3,962,513 is suitable in that recording sensitivity is enhanced. Acrylic cross-linked polymers described in U.S. Pat. No. 3,574,657 have high sensitivity and are thus suitable. Further, the sensitivity is relatively improved also by the use of heat-decomposable resins of polyesters, polymethyl methacrylates, and polyoxymethylenes described in U.S. Pat. No. 4,054,094. WO90-01635 and 94-01280 describe a group of polymers excellent in heat-decomposability, and any of these are suitable from the viewpoint of sensitivity. The sensitivity can be improved by the addition of halogen, Ge, Si and the like to a chalcogen-based recording layer, or by the addition, as a constituting component, of an alkaline metal such as Na, K and the like, an alkaline earth metal such as Ca, Sr, and the like, a IVb group element such as Si, Ge, Sn, Pb, and the like, a IIIb group element such as Tl, Al, In, and the like, a IIb group element such as Zn and the like, a lanthanum-based rare earth element such as Eu, Sm, and the like, an actinide rare earth element such as U and the like, as well as other elements, as described in JP-A No. 50-11307. As described in JP-A No. 52-37140, used of an aluminum substrate having an anodized coating of 0.5 μm or more is advantageous from the viewpoint of heat scattering. Addition of compounds (CrS, $Cr_2S$, $Cr_2S_3$, $MoS_2$, MnS, FeS, $FeS_2$, CoS, $Co_2S_3$, NiS, $Ni_2S$, PbS, $Cu_2S$, $Ag_2S$, ZnS, $In_2S_3$, GeSx (wherein, x represents a positive integer) , SnS, $SnS_2$, PbS, $As_2S_3$, $Sb_2S_3$, $Bi_2S_2$, $MgF_2$, $CaF_2$, $RhF_3$, MoO, InO, $In_2O$, $In_2O_3$, GeO, PbO) to a metal recording layer which is deformed by heating, or making the metal recording layer into a multi-layer structure as described in JP-A No. 53-33702 is effective for high sensitization. When a light absorbing agent is combined with a halogen-containing polymer as disclosed in JP-A No. 62-9993, sensitivity preferably increases. Further, a recording layer mainly composed of a light absorbing agent, thermoplastic resin and a lower molecular weight compound soluble in an organic solvent as disclosed in JP-A No. 5-138848 is advantageous from the viewpoints of recording sensitivity and blemishability of a print. When cyanoacrylate polymers (poly (methyl-2-cyanoacrylate), poly(methyl-2-cyanoacrylate-co-ethyl-2-cyanoacrylate), poly(methoxyethyl-2-cyanoacrylate), and the like) are used as a binder as described in U.S. Pat. No. 5,605,780, a planographic plate precursor excellent in printability having relatively high sensitivity is obtained since the binder is excellent in heat decompability.

An additive for improving the various properties thereof as a printing plate precursor may be added to layer (c). As preferable examples of the additive, the above-described heat acid generators, coloring agents, surfactants, plasticizers and the like exemplified for layer (b) are listed.

The substrate will now be described.

The substrate used in the planographic printing plate precursor of the present invention has at least a surface which is hydrophilic. As such a substrate, conventionally known hydrophilic substrates used for planographic printing plates can be used without limitation. The substrate used is preferably a dimensionally stable plate material, and examples thereof include paper, paper laminated with a plastic (for example, polyethylene, polypropylene, polystyrene or the like), metal plates (for example, aluminum, zinc, copper and the like), plastic films (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinylacetal and the like), paper and plastic films laminated or deposited with the above-described metals, and the like, and suitable known physical or chemical treatments may be optionally performed on the surface of these substrates for the purpose of imparting hydrophilicity, increasing strength and the like.

In particular, as preferable substrates, paper, polyester films or aluminum plates are listed, and among these, particularly preferable is an aluminum plate which has excellent dimensional stability, is relatively cheap, and can provide a surface excellent in hydrophilicity and strength through surface treatment according to demands. Further, a complex sheet prepared by bonding an aluminum sheet on a polyethylene terephthalate film is also preferable as described in JP-B No. 48-18327. As the aluminum plate, a pure aluminum sheet, and alloy plates mainly composed of aluminum and containing a small amount of hetero atoms are suitably used, and further, plastic films on which aluminum is laminated or deposited are permissible. Examples of the hetero atoms contained in the aluminum alloy include silicon, iron, manganese, copper, magnesium, chromium, zinc, bismuth, nickel, titanium and the like. The content of hetero elements in the alloy is at most 10% by weight. In the present invention, particularly preferable aluminum is pure aluminum, however, it is difficult to produce completely pure aluminum due to refining technology, therefore, aluminum containing a slight amount of hetero elements may also be allowable. Thus, the composition of the aluminum plate used in the present invention is not specified, and an aluminum plate composed of conventionally known and used materials can be appropriately utilized. The thickness of the aluminum plate used in the present invention is from about 0.1 mm to 0.6 mm, preferably from 0.15 mm to 0.4 mm, and particularly preferably from 0.2 mm to 0.3 mm.

In the case of a substrate having a metal surface, in particular an aluminum surface, it is preferable that a surface treatment such as a roughening (graining) treatment, immersion treatment in an aqueous solution of sodium silicate, potassium fluorinated zirconate, phosphate salt and the like, or an anodizing treatment is performed.

The roughening treatment of the surface of an aluminum plate is conducted by various methods, for example, a mechanical roughening method, a method for electrochemically dissolving and roughening the surface, and a method for selectively dissolving the surface chemically. As mechanical methods, known methods can be used such as a ball grinding method, brush grinding method, blast grinding method, buffing grinding method and the like. As electrochemical roughening methods, there are methods using alternating current or direct current in an electrolyte solution such as hydrochloric acid, nitric acid and the like. Also, a method combining both means can be used as disclosed in JP-A No. 54-63902. Prior to the roughening of an aluminum plate, if desired, there may be conducted, for example, a degreasing treatment using a surfactant, organic solvent or alkaline aqueous solution for removing rolling oil on the surface.

Further, there is preferably used an aluminum plate which is, after roughening treatment, subjected to immersion treatment in an aqueous sodium silicate solution. As described in JP-B No. 47-5125, an aluminum plate is suitably used which is subjected to anodizing treatment, then, immersed into an aqueous solution of an alkaline metal silicate. The anodizing treatment is carried out by applying current using aluminum as an anode in an electrolyte solution composed solely of, for example, an aqueous solution or non-aqueous solution of an inorganic acid such as phosphoric acid, chromic acid, sulfuric acid, boric acid and the like, or an inorganic acid such as oxalic acid, sulfamic acid and the like, or salts thereof, or composed of a combination of two or more of these.

Further, silicate electric deposition as described in U.S. Pat. No. 3,658,662 is also effective.

Further, surface treatment combining a substrate on which an electrolytic grain is applied, the above-described anodizing treatment and sodium silicate treatment is also useful as disclosed in JP-B No. 46-27481 and JP-A Nos. 52-58602 and 52-30503.

As disclosed in JP-A No. 56-28893, a substrate which is subjected to mechanical roughening, chemical etching, electrolytic grain, anodizing treatment and sodium silicate treatment in sequence is also suitable.

Further, a substrate on which a water-soluble resin, for example, a polymer and copolymer containing as the side chain a polyvinylphosphonate group or sulfonate group, polyacrylic acid, water-soluble metal salt (for example, zinc borate) or yellow dye, amine salt and the like is applied as a primer, after the above-described treatments, is also suitable.

As disclosed in Japanese Patent Application No. 5-304358, there is also suitably used a sol-gel treated substrate on which a functional group which may cause addition reaction by radical is bonded by covalent linkage.

As other preferable examples, there are also listed those prepared by providing a water resistant hydrophilic layer as the surface layer on any substrate. As such a surface layer, there are listed, for example, layers composed of an inorganic pigment and a bonding agent described in U.S. Pat. No. 305,295 and JP-A No. 56-13168, a hydrophilic swelling layer described in JP-A No. 9-80744, and a sol-gel film composed of titanium oxide, polyvinyl alcohol and silicic acids described in Japanese Patent Application National Publication (Laid-Open) No. 8-507727.

The planographic printing plate precursor of the present invention is produced in the manner described above. In particular, a method is preferable in which an image is exposed by a solid laser or semiconductor laser which emits an infrared ray having a wavelength of 700 nm to 1200 nm to produce a plate. In the present invention, the printing plate may be installed in a printing machine immediately after image exposure and printing may be conducted, however, if necessary, it is also possible that the printing plate precursor is previously installed in a printing machine and image exposure is conducted on the printing-machine and printing is conducted in such a condition. Production of a printing plate in this way is preferable since the production process can be simplified. However, between the image exposure process and the printing process, there may be conducted post treatment processes such as washing of the surface of a recording layer and post heating, if necessary. By these processes, it becomes possible to further improve the resistance to blemishing of non-image portions, strengthen image portions, improve printing durability and scratch resistance, and decrease the exposure time necessary for image exposure, or maintain desirable surface properties of a planographic printing plate after image exposure for a longer period of time.

The planograhic printing plate precursor (1) having undergone image exposure can be developed with water after the exposure, subjected to gum coating if necessary, then, installed in a printing machine for conducting printing, and further, can also be installed in a printing machine immediately after exposure (without a developing process) to conduct printing. Namely, in the plate production method using the planographic printing plate precursor of the present invention, a planographic printing plate can be produced without a particular developing treatment. The water development in the present invention indicates development using a developing solution having a pH of 2 or more composed of water or mainly composed of water.

The planographic printing plate obtained by such treatment is applied to an offset printing machine, and used for printing for providing a large number of prints.

EXAMPLES

The following examples further illustrate the present invention in detail below, but do not limit the scope thereof.

Preparation of Substrate

An aluminum plate (material 1050) having a thickness of 0.30 mm was degreased by washing with trichloroethylene. A roughening treatment was applied to the aluminum plate by graining the surface with a nylon brush and a suspension in which a 400 mesh powder of pumice stone was suspended in water. The plate was then washed with water. The plate was etched by being immersed in a 25% aqueous solution of sodium hydroxide at 45° C. for 9 seconds and washed with water. The plate was further immersed in a 2% $HNO_3$ for 20 seconds and washed with water. The etching amount of the grained surface was about 3 g/m$^2$. Then, the plate was provided with a direct current anodic oxidization film of about 3 g/m$^2$ with 7% $H_2SO_4$ as the electrolyte and a current density of 15 A/dm$^2$, washed with water, and dried. The resulting substrate was named S-1. The contact angle against a water drop in air of S-1 was 10° or less.

Example of Planographic Printing Plate (1)

Synthesis of Hydrophilic Polymer Compound 0.5 g of benzoyl peroxide was added as a polymerization initiator to 60 g of vinyl acetate and 40 g of methyl acrylate, and the resulting mixture was dispersed in 300 ml of water containing 3 g of a partially saponified polyvinyl alcohol and 10 g of NaCl as dispersing stabilizers.

The dispersion was stirred for 6 hours at 65° C. to conduct suspension polymerization. The content of the methyl acrylate component in the resulting copolymer was identified by NMR spectrum at 48 mol %. The intrinsic viscosity in a benzene solution at 30° C. was 2.10.

Then 8.6 g of this copolymer was added to a saponification reaction solution composed of 200 g of methanol, 10 g of water and 40 ml of 5N NaOH and the mixture was stirred in suspension, saponification reaction was conducted at 25° C. for 1 hour, then, the temperature was increased to 65° C. and further saponification reaction was conducted for 5 hours.

The resulting saponification reaction product was washed fully with methanol, and freeze-dried. The degree of saponification was 98.3 mol %, and it was verified as a result of infrared spectrum measurement that strong absorption derived from —COO— group was 1570 cm$^{-1}$.

Synthesis of Heat Sensitive Polymer Compound

Synthesis of Monomer (4)

200 ml of acetonitrile, 11 g of cyclohexyl alcohol and 8.8 g of pyridine were charged into a 500 ml three-necked flask, and stirred. To this was added 20.2 g of vinylbenzenesulfonyl chloride dropwise while being cooled with ice. After completion of the addition, the mixture was stirred for 2 hours, then, poured into 1 liter of water and extracted with ethyl acetate. The product was dried over magnesium sulfate, then the solvent was distilled under reduced pressure, and the residue was purified by column chromatography on silica gel to obtain a monomer (4). Element Analysis: the calculated values were; C, 63.13%; H, 6.81%; the actual values were; C, 63.01%; H, 6.85%.

Synthesis of Monomer (5)

A monomer (5) was synthesized in the same manner as for the monomer (4) except that 2,2,2-trifluoroethyl alcohol was used instead of cyclohexyl alcohol.

Synthesis of Monomer (10)

A monomer (10) was synthesized in the same manner as for the monomer (4) except that the alcohol described below was used instead of cyclohexyl alcohol.

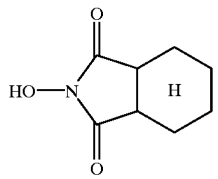

Synthesis of Monomer (49)

1.06 g of 2,4-dinitrotoluene, then 500 g of methacrylic acid and 488 g of dihydropyran were charged into a 500 ml three-necked flask. To this mixture was added concentrated hydrochloric acid while being cooled with ice. After completion of the addition, the reaction mixture was warmed to about 60° C. and stirring was continued for 2 hours and 30 minutes at the same temperature. The reaction mixture was cooled to room temperature, and the reaction mixture was changed to alkaline with an aqueous sodium hydroxide solution. From this mixture, product was extracted with ethyl acetate, and the organic layer was dried over magnesium sulfate then concentrated under reduced pressure. The resulting solution was verified by identification by NMR that: monomer (49): 88.1% by weight, ethyl acetate: 12.9% by weight.

Synthesis of Heat Sensitive Polymer Compound (1)

20 g of the monomer (4) and 40 g of methyl ethyl ketone were charged into a 200 ml three-necked flask, and to this was added 0.25 g of azobisdimethylvaleronitrile at 65° C. under nitrogen flow. This temperature was maintained for 5 hours while being stirred, then the solvent was distilled off under reduced pressure, to obtain a solid material. By GPC, it was verified as a polymer having a weight-average molecular weight of 15200.

Synthesis of Heat Sensitive Polymer Compounds (2) to (4)

Heat sensitive polymer compounds (2) to (4) were synthesized in the same manner as for the heat sensitive polymer compound (1) except the raw material monomer (4) was changed for the monomers shown in the following Table 1. The average molecular weights of the resulting polymers are shown in the following Table 1.

TABLE 1

| | Monomer used | | Weight-average molecular weight |
|---|---|---|---|
| Heat sensitive polymer compound (2) | Monomer (5) | 20 g | 16000 |
| Heat sensitive polymer compound (3) | Monomer (10) | 20 g | 18000 |
| Heat sensitive polymer compound (4) | Monomer (49) | 20 g | 20000 |

Synthesis of Heat Sensitive Polymer Compound (5)

7.18 g of the monomer (4), 0.31 g of ethyl acrylate and 15 g of methyl ethyl ketone were charged into a 100 ml three-necked flask, and to this was added 0.1 g of azobisdimethylvaleronitrile at 65° C. under nitrogen flow. The mixture was stirred for 5 hours at the same temperature, then, the methyl ethyl ketone was distilled off under reduced pressure, to obtain a solid material. By GPC (polystyrene standard), it was recognized as a polymer having a weight-average molecular weight of 18000.

Synthesis of Heat Sensitive Polymer Compounds (6) to (8)

Heat sensitive polymer compounds (6) to (8) were synthesized in the same manner as for the heat sensitive polymer compound (5) except the raw material monomer (4) was replaced by the monomers shown in the following Table 2. The average molecular weights of the resulting polymers are shown in the following Table 2.

TABLE 2

| | Monomer used | | Weight-average molecular weight |
|---|---|---|---|
| Heat sensitive polymer compound (6) | Monomer (5) | 7.18 g | 16000 |
| Heat sensitive polymer compound (7) | Monomer (10) | 9.05 g | 18000 |
| Heat sensitive polymer compound (8) | Monomer (49) | 4.59 g | 25000 |

Examples 1 to 9

The following solution [A] was coated on the above-described substrate S-1, and dried for 2 minutes at 100° C. to obtain an aluminum plate coated with a layer (a). The weight after drying was 1.1 g/m$^2$.

Solution [A]

| | |
|---|---|
| Hydrophilic polymer compound | 1.0 g |
| Fluorine-based surfactant (trade name: Megafack F-177, manufactured by Dainippon Ink & Chemicals, Inc.) | 0.06 g |
| Methyl alcohol | 5.0 g |
| Purified water | 5.0 g |
| (Only to [B-9],) dye 1 | 0.08 g |

Nine solutions [B-1] to [B-9] were prepared by changing the type of heat sensitive polymer compound in the following solution [B] as is shown in Table 3. The resulting solutions were respectively coated on the above-described aluminum plate coated with layer (a), and dried at 80° C. for 3 minutes to obtain planographic printing plate precursors [B-1] to [B-9]. The weight after drying was 1.2 g/m$^2$.

Solution [B]

| | |
|---|---|
| Heat sensitive polymer compound (Table 3) | 4.0 g |
| Infrared ray absorbing agent (IR-125, manufactured by Wako Pure Chemical Industries Ltd.) | 0.15 g |
| Acid generator: Salt of diphenyliodoniumanthraquinonesulfonic acid | 0.15 g |
| Dye in which counter ion in Victoria Pure Blue BOH is changed to 1-naphthalenesulfonic acid | 0.05 g |
| Fluorine-based surfactant (Megafack F-177, manufactured by Dainippon Ink & Chemicals, Inc.) | 0.06 g |
| Methyl ethyl ketone | 20 g |
| γ-Butyrolactone | 10 g |
| 1-Mehoxy-2-propanol | 8 g |
| Water | 2 g |

TABLE 3

| | Planographic printing plate precursor | Heat sensitive polymer compound |
|---|---|---|
| Example 1 | [B-1] | (1) |
| Example 2 | [B-2] | (2) |
| Example 3 | [B-3] | (3) |
| Example 4 | [B-4] | (4) |
| Example 5 | [B-5] | (5) |
| Example 6 | [B-6] | (6) |
| Example 7 | [B-7] | (7) |
| Example 8 | [B-8] | (8) |
| Example 9 | [B-9] | (1) |

The resulting planographic printing plate precursors [B-1] to [B-9] were exposed by YAG laser emitting an infrared ray having a wavelength of 1064 nm at laser power: 360 mW and scanning speed: 3.0 m/s. After the exposure, they were heated at 110° C. for 1 minute, then printed using a Hydel KOR-D Machine. In this procedure, it was observed whether blemishes occured on non-image portions of the print or not. The results are shown in Table 4.

TABLE 4

| | Planographic printing plate precursor | Blemishes on non-image portions in printing |
|---|---|---|
| Example 1 | [B-1] | None |
| Example 2 | [B-2] | None |

TABLE 4-continued

| | Planographic printing plate precursor | Blemishes on non-image portions in printing |
|---|---|---|
| Example 3 | [B-3] | None |
| Example 4 | [B-4] | None |
| Example 5 | [B-5] | None |
| Example 6 | [B-6] | None |
| Example 7 | [B-7] | None |
| Example 8 | [B-8] | None |
| Example 9 | [B-9] | None |

As is apparent from the results of Table 4, according to the planographic printing plate of the present invention, excellent prints having no blemishes on non-image portions were obtained even at the low energy exposure of a 3.0 m/s scanning speed.

Comparative Examples 1 to 8

Eight solutions [C-1] to [C-8] were prepared by changing the type of heat sensitive polymer compound in the following solution [C]. The resulting solutions were respectively coated on the above-described aluminum plate S-1 treated as described above, and dried at 100° C. for 2 minutes to obtain planographic printing plate precursors [C-1] to [C-8]. The weight after drying was 1.2 g/$m^2$.

Solution [C]

| | |
|---|---|
| Heat sensitive polymer compound (Table 5) | 4.0 g |
| Infrared ray absorbing agent (IR-125, manufactured by Wako Pure Chemical Industries Ltd.) | 0.15 g |
| Acid generator: Salt of diphenyliodoniumanthraquinonesulfonic acid | 0.15 g |
| Dye in which counter ion in Victoria Pure Blue BOH is changed to 1-naphthalenesulfonic acid | 0.05 g |
| Fluorine-based surfactant (Megafack F-177, manufactured by Dainippon Ink & Chemicals, Inc.) | 0.06 g |
| Methyl ethyl ketone | 20 g |
| γ-Butyrolactone | 10 g |
| 1-Methoxy-2-propanol | 8 g |
| Water | 2 g |

TABLE 5

| | Planographic printing plate precursor | Heat sensitive polymer compound |
|---|---|---|
| Comparative example 1 | [C-1] | (1) |
| Comparative example 2 | [C-2] | (2) |
| Comparative example 3 | [C-3] | (3) |
| Comparative example 4 | [C-4] | (4) |
| Comparative example 5 | [C-5] | (5) |
| Comparative example 6 | [C-6] | (6) |
| Comparative example 7 | [C-7] | (7) |
| Comparative example 8 | [C-8] | (8) |

One of the two planographic printing plate precursors obtained for each of [C-1] to [C-8] was exposed by YAG laser emitting an infrared ray having a wavelength of 1064 nm at laser power: 360 mW and scanning speed: 2.0 m/s and the other of each of the plates was exposed by the YAG laser at laser power: 360 mW and scanning speed: 3.0 m/s. After the exposure, both plates were heated at 110° C. for 1 minute, then printed using a Hydel KOR-D Machine. In this procedure, it was observed whether blemishes occured on non-image portions of the print or not. The results are shown in Table 6.

TABLE 6

| | Planographic printing plate precursor | Blemishes on non-image portions in printing | |
|---|---|---|---|
| | | Scanning Speed: 2.0 m/s | Scanning Speed: 3.0 m/s |
| Comparative example 1 | [C-1] | None | slightly |
| Comparative example 2 | [C-2] | None | slightly |
| Comparative example 3 | [C-3] | None | |
| Comparative example 4 | [C-4] | None | slightiy |
| Comparative example 5 | [C-5] | None | |
| Comparative example 6 | [C-6] | None | |
| Comparative example 7 | [C-7] | None | |
| Comparative example 8 | [C-8] | None | slightly |

As apparent from the results of Table 6, it was found that in the planographic printing plates of the comparative examples obtained by forming only a recording layer corresponding to layer (b) in the present invention, when exposed at a scanning speed of 2.0 m/s, there was no problem, however, when exposed at a scanning speed of 3.0 m/s, all of the resulting prints had blemishes on non-image portions, and there were problems with developability when exposed at low energy.

Examples of Planographic Printing Plate (2)

S-2

A coating solution having the composition described below was prepared using a sulfonic acid generating polymer (1p-7, GPC weight-averagemolecular weight: 20000, heat decomposition temperature by TGA: 155° C.) The resulting solution was coated on the hydrophilic treated surface of S-1 by a spin coater so that the amount coated after drying at 100° C. for 2 minutes was 0.3 g/$m^2$. The substrate having the intermediate layer (layer (b)) thus provided was called S-2. The surface had a contact angle against a water drop in air of 80°.

(Intermediate Layer Coating Solution)

| | |
|---|---|
| Sulfonic acid generating polymer | 5 g |
| Methyl ethyl ketone | 80 g |
| Dimethylacetamide | 20 g |

S-3

A substrate S-3 was obtained in the same manner as for S-2 except that a sulfonic acid generating polymer (1p-2, GPC weight-average molecular weight: 10000, heat decomposition temperature by TGA: 120° C.) was used and the amount coated was 0.2 g/$m^2$. The surface had a contact angle against a water drop in air of 100°.

S-4

A substrate S-4 was obtained in the same manner as for S-2 except that a sulfonic acid generating polymer (1p-8, GPC weight-average molecular weight: 50000, heat decomposition temperature by TGA: 134° C.) was used and the amount coated was 0.5 g/$m^2$. The surface had a contact angle against a water drop in air of 90°.

S-5

A substrate S-5 was obtained in the same manner as for S-2 except that a sulfonic acid generating polymer (1p-26, GPC weight-average molecular weight: 30000, heat decomposition temperature by TGA: 160° C.) was used and the amount coated was 1.0 g/$m^2$. The surface had a contact angle against a water drop in air of 80°.

S-6

A substrate S-6 was obtained in the same manner as for S-2 except that a sulfonic acid generating polymer (1p-25, GPC weight-average molecular weight: 30000, heat decomposition temperature by TGA: 155° C.) was used and the amount coated was 0.2 g/$m^2$. The surface had a contact angle against a water drop in air of 80°.

S-7

A substrate S-7 was obtained in the same manner as for S-2 except that a sulfonic acid generating polymer (1p-21, GPC weight-average molecular weight: 30000, heat decomposition temperature by TGA: 145° C.) was used and the amount coated was 0.2 g/$m^2$. The surface had a contact angle against a water drop in air of 75°.

S-8

A substrate S-8 was obtained in the same manner as for S-2 except that a carboxylic acid generating polymer (homopolymer having structure a-15, GPC weight-average molecularweight:100,000) was used instead of the sulfonic acid generating polymer and the amount coated was 0.2 g/$m^2$.

S-9

A substrate S-9 was obtained by heating the substrate S-3 in an oven at 150° C. for 1 minute. Infrared absorption spectra of the surfaces of S-3 and S-9 were measured by the FT-IR diffusion reflection method. Absorptions at 1359 $cm^{-1}$ and 1099 $cm^{-1}$ derived from sulfonates observed in S-3 disappeared in S-9, and instead, absorptions at 1041 $cm^{-1}$ and 1012 $cm^{-1}$ derived from sulfonates were observed. Namely, it was found that the sulfonic acid generating ability of the sulfonic acid generating polymer contained in the intermediate layer coated on the substrate S-9 was lost. The surface of the substrate S-9 had a contact angle against a water drop in air of 10° or less.

Examples 10 to 14, Comparative Examples 9, 10

Copper metal was deposited by vacuum deposition on the surfaces of the substrates S-2, S-3, S-4, S-7, S-8 and the hydrophilic substrate S-1 having the intermediate layer of the present invention obtained as described above, and the substrate S-9 having the intermediate layer containing no functional group represented by the general formulae (1) to (5) so as to form copper films having a thickness of 100 Å, to obtain the planographic printing plate precursors of Examples 10 to 14, and Comparative Examples 9 and 10, respectively. These were exposed image-wise by a YAG laser having an oscillation wavelength of 1064 nm, an output of 1W, and a beam diameter of 20 mm, and offset printing was conducted using a Hydel KOR-D Machine. The resistance to blemishing of the resulting prints were evaluated visually according to the following standard.

Evaluation-of blemish resistance

◎: No blemishing over a wide range of water/ink balance

○: Slight blemishing depending on water/ink balance

The results of the printing and the evaluation of blemish resistance are shown in the following Table 7.

Examples 15 to 19, Comparative Examples 11, 12

The printing plate precursors obtained in the above-described Examples 10 to 14, Comparative Examples 9 and 10 were stored for 3 days under conditions of a temperature of 60° C. and a humidity of 45% RH, then were exposed image-wise under the same conditions as in Example 1 and printing was conducted. The results are shown in Table 7 below.

TABLE 7

| | Polymer used in intermediate layer | Printing evaluation result |
|---|---|---|
| Example 10 | 1 p-7*1 | 10000 or more excellent prints were obtained. Blemishing resistance: ◎ |
| Example 11 | 1 p-2*1 | 10000 or more excellent prints were obtained. Blemishing resistance: ◎ |
| Example 12 | 1 p-8*1 | 10000 or more excellent prints were obtained. Blemishing resistance: ◎ |
| Example 13 | 1 p-21*1 | 10000 or more excellent prints were obtained. Blemishing resistance: ◎ |
| Example 14 | a-15*2 | 10000 or more excellent prints were obtained. Blemishing resistance: ○ |
| Comparative example 9 | No intermediate layer | Whole surface was blemished significantly, and no image-wise print was obtained. |
| Comparative example 10 | Containing sulfonate group | Image portions became faint after fewer than 100 prints. |
| Example 15 | 1 p-7*1 | 10000 or more excellent prints were obtained. |
| Example 16 | 1 p-2*1 | About 5000 excellent prints were obtained. |
| Example 17 | 1 p-8*1 | 10000 or more excellent prints were obtained. |
| Example 18 | 1 p-21*1 | 10000 or more excellent prints were obtained. |
| Example 19 | a-15*2 | About 4000 excellent prints were obtained. |
| Comparative example 11 | No intermediate layer | Whole surface was blemished significantly, and no image-wise print was obtained. |
| Comparative example 12 | Sulfonate group*3 | Image portions became faint after fewer than 100 prints. |

*1: Sulfonic acid generating polymer
*2: Carboxylic acid generating polymer
*3: 1 p-8 heated product, containing sulfonate group When the planographic printing plates of the examples having the layer (b) and the layer (c) of the present invention were applied directly to a printing machine after exposure and printing was conducted, a large number of excellent prints were obtained, as is apparent from Table 7. Further, it was found from comparison between Example 10 and Example 14 that the print using a sulfonic acid generating polymer is more excellent than the print using a carboxylic acid generating polymer. This tendency did not change after storage of the planographic printing plate precursors at a high temperature and a high humidity, and it was found that the planographic printing plate precursors of the present invention have excellent storability at a high temperature and a high humidity.

Examples 20, 21, Comparative Examples 13

A coating solution having the composition described below was coated at a coating weight of 1 g/$cm^2$ as a recording layer (layer(c)) on the substrates S-5, S-6 and S-1 to obtain the planographic printing plate precursors of Examples 20 and 21 and Comparative Example 13, respectively. These plates were exposed using a YAG laser having an oscillation wavelength of 1064 nm, an output of 1W and a beam diameter of 30 mm while the scanning speed was continuously changed. Printing was conducted using the resulting printing plates, and the line width at which it became impossible for ink to adhere by exposure was determined using a microscope, and exposing energy at the plate surface at which the line width was 30 mm was measured as a sensitivity value. The results are shown in Table 8 below.

Coating Solution for Recording Layer poly(α-methylstyrene) 1.0 g

Infrared ray absorbing agent 0.15 g (NK-3508, manufactured by Nippon Kanko Shikiso Kenkyusho K. K.)

| | |
|---|---|
| Dye in which counter ion in Victoria Pure Blue BOH is changed to 1-naphthalenesulfonic acid | 0.05 g |
| Fluorine-based surfactant (Megafack F-177, manufactured by Dainippon Ink & Chemicals, Inc.) | 0.06 g |
| Methyl ethyl ketone | 20 g |
| Methyl alcohol | 7 g |

NK-3508

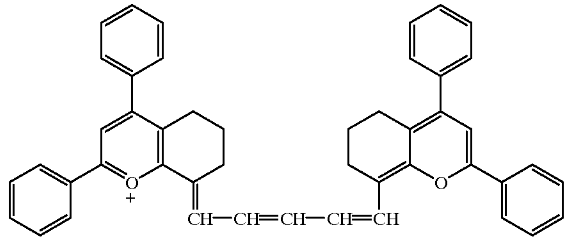

$ClO_4^-$

TABLE 8

| | Polymer used in intermediate layer | Sensitivity |
|---|---|---|
| Example 20 | 1 p-25*1 | 200 mJ/cm$^2$ |
| Example 21 | 1 p-21*1 | 200 mJ/cm$^2$ |
| Comparative example 13 | No intermediate layer | 500 mJ/cm$^2$ |

*1: Sulfonic acid generating polymer

As is apparent from Table 8, the planographic printing plates of the present invention has excellent sensitivity, and can provide excellent writing even by exposure at low energy.

Example 22

A planographic printing plate precursor was made in the same manner as in Example 20 except that the infrared ray absorbing agent in the recording layer was substituted by IR-125 (manufactured by Wako Pure Chemical Industries Ltd.). This plate precursor was exposed image-wise using a semiconductor laser having an oscillation wavelength of 840 nm and an output of 500 mW, then printing was conducted to obtain 10000 or more excellent prints having no faintness in image portions and no contamination on non-image portions at all.

Examples of Planographic Printing Plate (3)

A thin film of Ti was made by vacuum deposition so that the thickness thereof was 300 Å as the layer (c) on the substrate S-1. The resulting sample was called M-1. Then, a coating solution having the composition described below was prepared. The resulting coating solution was coated on M-1 by a spin coater so that the amount coated after drying at 100° C. for 2 minutes was 1.0 g/m$^2$. Thus, a printing plate precursor P-1 was obtained as Example 23. The surface of P-1 had a contact angle against a water drop in air of 80°.

| | |
|---|---|
| Sulfonic acid generating polymer (1p-7, GPC weight-average molecular weight: 20,000, heat decomposition temperature by TGA: 155° C.) | 15 g |
| Methyl ethyl ketone | 80 g |
| Dimethylacetamide | 20 g |

The resulting P-1 was exposed image-wise with scanning using a semiconductor laser optical system having an oscillation wavelength of 840 nm, a beam diameter of 30 μm and an energy at the plate surface of 20 mW under conditions where the energy concentration was 200 mJ/cm$^2$. The obtained plate could be immediately subjected to offset printing using a Hydel KOR-D Machine to obtain 10000 or more excellent positive prints.

Comparative Example 14

Plate C-1 for comparison was obtained in the same manner as for the production of P-1 except that the layer (c) was not provided on the substrate S-1. The contact angle against a water drop in air of the surface of C-1 was 80°. Then, C-1 was heated in an oven at 150° C. for 1 minute, and the infrared absorption spectrum was measured before and after the heating. As a result, absorptions at 1359 cm$^{-1}$ and 1099 cm$^{-1}$ derived from sulfonates observed before the heating disappeared completely, and instead, absorptions at 1041 cm$^{-1}$ and 1012 cm$^{-1}$ derived from sulfonates were recognized. The surface after the heating had a contact angle against a water drop in air of 10° or less.

The substrate C-1 was used, and the whole surface was exposed with scanning using the same semiconductor laser optical system as in Example 23 under conditions where the energy concentration was 200 mJ/cm$^2$. The contact angle against a water drop in air of the surface after exposure was 80°, and also regarding FT-IR, no change was recognized before and after the exposure. Further, scanning exposure was conducted image-wise using the same semiconductor laser optical system as in Example 1 under conditions where the energy concentration was 200 mJ/cm$^2$, then immediately offset printing was conducted under the same conditions as for Example 23. As a result, ink adhered to the whole surface and no image was obtained at all.

Comparative Example 15

Further, M-1 on which the layer (b) was not provided in Example 23 was subjected to image-wise scanning exposure using the same semiconductor laser optical system as in Example 23 under conditions where the energy concentration was 200 mJ/cm$^2$, then immediately offset printing was conducted under the same conditions as for Example 23. As a result, ink adhered to the whole surface and no image was obtained at all. When the exposure energy concentration was changed to 100 mJ/cm$^2$ and printing was conducted, prints were obtained, however, scratch-like adhesion was observed in image portions and printing durability of only 1000 sheets or less could be obtained.

The printing plate precursor P-1 in Example 23 has sufficient sensitivity for scanning exposure, and provides excellent printing plates even without post treatment after exposure. Since the sulfonic acid generating polymer Ip-7 in layer (b) is excellent in heat sensitivity, as a result, P-1 has excellent discrimination of hydrophobicity/hydrophilicity before and after exposure. Further, P-1 has high sensitivity, and has excellent scratch resistance and printing durability as compared with the conventional printing plate precursor M-1 for heat mode exposure.

Examples 24 to 27

A printing plate precursor P-2 was produced as Example 24 in the same manner as in Example 23 except that the amount coated of a sulfonic acid generating polymer in layer (b) was changed to 2.0 g/$m^2$. A printing plate precursor P-3 was produced as Example 25 in the same manner as in Example 23 except that the sulfonic acid generating polymer in the heat sensitive layer was changed to Ip-2 from Ip-7 and the amount coated was changed to 1.5 g/$m^2$. A printing plate precursor P-4 was produced as Example 26 in the same manner as in Example 23 except that the sulfonic acid generating polymer in layer (b) was changed to Ip-8 from Ip-7 and the amount coated was changed to 1.2 g/$m^2$. A printing plate precursor P-5 was produced as Example 27 in the same manner as in Example 23 except that the sulfonic acid generating polymer in layer (b) was changed to a-15 from Ip-7 and the amount coated was changed to 1.5 g/$m^2$. The weight-average molecular weights and weight reduction temperatures in TGA of the polymers used in layer (b) are shown below.

Ip-7: GPC weight-average molecular weight: 50000
TGA weight reduction temperature: 155° C.

Ip-2: GPC weight-average molecular weight: 10000
TGA weight reduction temperature: 120° C.

Ip-8: GPC weight-average molecular weight: 25000
TGA weight reduction temperature: 134° C.

a-15: GPC weight-average molecular weight: 30000
10% by weight of cyclohexyl benzenesulfonate was added.

Comparative Examples 16 to 17

A printing plate precursor C-2 was produced as Comparative Example 16 in the same manner as in Comparative Example 14 except that the sulfonic acid generating polymer in layer (b) was changed to Ip-2 from Ip-7 and the amount coated was changed to 1.5 g/$m^2$. A printing plate precursor C-3 was produced as Comparative Example 17 in the same manner as in Comparative Example 15 except that the intermediate layer of the Ti thin film having a thickness of 300 Å to a layer (c) of a Sn thin film having a thickness of 100 Å.

In Examples 24 to 27 and Comparative Examples 16 to 17, image-wise laser exposure was conducted in the same manner as in Example 23 and Comparative Examples 14 to 15, and printing was conducted using the prepared printing plates without further treatment. The printing durability, scratch resistance and blemishing resistance thereof were evaluated according to the following standards.

Printing durability: Faintness in the printed images was observed visually, and printing was continued until prints which could not be used in practice were obtained, and the printing number before that was counted.

Scratch resistance: Scratch-like ink adhesion on solid portions was observed visually, and evaluated according to the following standard.

○: No practical problem

X: Unusable in practice

Blemishing resistance: The blemishing in non-image portions was observed visually while changing the water-ink balance in printing, and evaluated according to the following standard.

⊚: No blemishing over a very wide range of water-ink balance

○: No blemishing over a wide range of water-ink balance

Δ: Some blemishing depending on the water-ink balance

Evaluation results are shown in Table 9.

TABLE 9

| Form plate No. | Structure of printing plate precursor: Intermediate layer component (film thickness) | Structure of printing plate precursor: Heat sensitive layer polymer (amount coated) | Exposure energy concentration | Printing result: Printing durability | Printing result: Scratch resistance | Printing result: Blemishing resistance |
|---|---|---|---|---|---|---|
| P-2 (Example 24) | Ti (150 Å) | 1 p-7 (2 g/$m^2$) | 175 mJ/$cm^2$ | 10000 or more | ○ | ⊚ |
| P-3 (Example 25) | Al (100 Å) | 1 p-2 (1.5 g/$m^2$) | 250 mJ/$cm^2$ | 10000 or more | ○ | ⊚ |
| P-4 (Example 26) | Sn (50 Å) | 1 p-8 (1.2 g/$m^2$) | 300 mJ/$cm^2$ | 10000 or more | ○ | ⊚ |
| P-5 (Example 27) | Ti (700 Å) | a-15 (1.5 g/$m^2$) | 300 mJ/$cm^2$ | 10000 or more | ○ | ○ |
| C-2 (Comparative example 16) | None | 1 p - 2 (1.5 g/$m^2$) | 1000 mJ/$cm^2$ | Whole surface is blemished and no image is obtained. | | |
| C-3 (Comparative example 17) | Sn (100 Å) | None | 600 mJ/$cm^2$ | 1000 | X | Δ |

Example 28

A coating solution having the composition described below was coated as layer (c) on a substrate so that the weight coated was 0.3 g/$m^2$, then, the same layer (b) as in Example 23 was provided. A plate precursor P-6 was obtained as Example 28. Then, P-6was exposed image-wise with scanning using a YAG laser optical system having an oscillation wavelength of 1064 nm, a beam diameter of 20 μm and an energy at the plate surface of 500 mW under conditions where the energy concentration was 350 mJ/$cm^2$. The obtained plate could be immediately subjected to offset printing to obtain 10000 or more sheets of excellent positive prints.

| | |
|---|---|
| Carbon black water dispersion (Solid content: 34.4% by weight) | 1.5 g |
| Polyvinylpyrrolidone (GPC weight-average molecular weight: 10000) | 1.5 g |
| Water | 100 g |
| Dimethylacetamide | 20 g |

It was recognized that the printing plate precursors of Examples 24 to 28 having layers (b) and (c) have a high sensitivity to IR laser exposure, and provide a printing plate having excellent printability without post treatment after exposure, as is apparent from Table 9 and Example 28.

Example 29

The above-described printing plate precursors P-1 to P-6 were produced and (A) :some of them were exposed to a fluorescent light for 6 hours, (B) : some of them were kept at a temperature of 45° C. and a humidity of 75% for 3 days, and (C) some of them were kept at a temperature of 60° C. and a humidity of 25%. All of them were exposed by laser, and printing evaluation was conducted. In the printing plate precursors exposed to conditions (A) to (C), no change was recognized in both drawing line width (sensitivity) and printability as compared with those directly after production and before exposure.

The planographic printing plate precursor of the present invention has sufficient scanning exposure sensitivity for practical use, and can provide a planographic printing plate having excellent printing durability, scratch resistance, and blemish resistance, without post treatment after exposure. Further, the planographic printing plate precursor of the present invention is a planographic printing plate precursor excellent in storage stability. The method for producing a planographic printing plate of the present invention is simple and excellent in environmental aspects since it requires no post treatment, as compared with conventional production methods.

What is claimed is:

1. A planographic printing plate precursor obtained by laminating on a substrate (b) a layer composed of a hydrophobic polymer which can be made hydrophilic by heating, and (c) a layer of which exposed portions can be removed by heat mode exposure.

2. A planographic printing plate precursor according to claim 1, wherein the layer (b) is composed of a hydrophobic polymer having at least one of groups represented by the following general formulae (1) to (5) in the side chain wherein said side chain is made hydrophilic by heating:

General formula (1)

$$—L—SO_2—O—R^1$$

General formula (2)

$$—L—SO_2—SO_2—R^2$$

General formula (3)

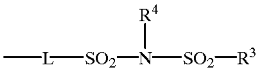

General formula (4)

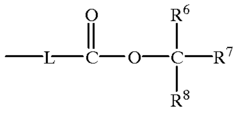

General formula (5)

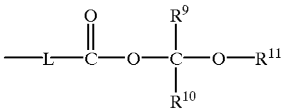

(wherein, L represents an organic group composed of a polyvalent non-metal atom necessary for connecting a substituent to a polymer main chain, $R^1$ represents a substituted or unsubstituted alkyl group, a substituted or unsubstituted aryl group, or a cyclic imide group, $R^2$ and $R^3$ represent a substituted or unsubstituted alkyl group or a substituted or unsubstituted aryl group, $R^4$ represents a substituted or unsubstituted alkyl group, a substituted or unsubstituted aryl group, or $—SO_2—R^5$, $R^5$ represents a substituted or unsubstituted alkyl group or a substituted or unsubstituted aryl group, $R^6$ to $R^{10}$ each independently represent a hydrogen atom, or an alkyl group, alkenyl group, acyl group, or alkoxycarbonyl group which may have a substituent, $R^{11}$ represents an alkyl group or alkenyl group which may have a substituent, and any two of $R^6$ to $R^8$ or any two of $R^9$ to $R^{11}$ may be connected to form ring structure composed of 3 to 8 carbon atoms or hetero atoms).

3. A method for producing a planographic printing plate wherein the planographic printing plate precursor of claim 2 is exposed, and developed utilizing a developing solution mainly composed of water having a pH of 2 or more or wetting water on a printing machine.

4. A planographic printing plate precursor according to claim 1, wherein the layer (b) is composed of a hydrophobic polymer having at least one of groups represented by general formulae (1) to (5) in the side chain wherein said side chain is made hydrophilic by heating General formula (1)

$$—L—SO_2—O—R^1$$

General formula (2)

$$—L—SO_2—SO_2—R^2$$

General formula (3)

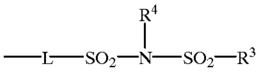

General formula (4)

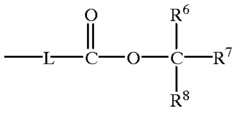

General formula (5)

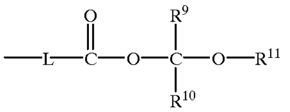

wherein, L represents an organic group composed of a polyvalent non-metal atom necessary for connecting a substituent to a polymer main chain, $R^1$ represents a substituted or unsubstituted alkyl group, a substituted or unsubstituted aryl group, or a cyclic imide group, $R^2$ and $R^3$ represent a substituted or unsubstituted alkyl group or a substituted or unsubstituted aryl group, $R^4$ represents a substituted or unsubstituted alkyl group, a substituted or unsubstituted aryl group, or $—SO_2—R^5$, $R^5$ represents a substituted or unsubstituted alkyl group or a substituted or unsubstituted aryl group, $R^6$ to $R^{10}$ each independently represent a hydrogen atom, or an alkyl group, alkenyl group, acyl group, or alkoxycarbonyl group which may have a substituent, $R^{11}$ represents an alkyl group or alkenyl group which may have a substituent, and any two of $R^6$ to $R^8$ or any two of $R^9$ to $R^{11}$ may be connected to form ring structure composed of 3 to 8 carbon atoms or hetero atoms.

5. A method for producing a planographic printing plate wherein the planographic printing plate precursor of claim 4 is subjected to heat mode exposure using an infrared laser-light having a longer wavelength than 700 nm.

6. The planographic printing plate precursor according to claim 1, wherein the layer (b) comprises a hydrophobic polymer having at least one of groups represented by the general formulae (1) and (3) in a side chain, said side chain being made hydrophilic by heating General formula (1)

$$—L—SO_2—O—R^1$$

General formula (2)

$$—L—SO_2—SO_2—R^2$$

-continued

General formula (3)

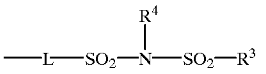

wherein, L represents an organic group composed of a polyvalent non-metal atom necessary for connecting a substituent to a polymer main chain, $R^1$ represents a substituted or unsubstituted alkyl group, a substituted or unsubstituted aryl group, or a cyclic imide group, $R^2$ and $R^3$ represent a substituted or unsubstituted alkyl group or a substituted or unsubstituted aryl group, and $R^4$ represents a substituted or unsubstituted alkyl group.

7. A planographic printing plate precursor obtained by laminating on a substrate (b) a layer composed of a hydrophobic polymer which can be made hydrophilic by heating, and (c) a layer of which exposed portions can be removed by heat mode exposure wherein the layer (b) and the layer (c) are laminated sequentially on a substrate having a hydrophilic surface.

8. A method for producing a planographic printing plate wherein the planographic printing plate precursor of claim 7 is subjected to heat mode exposure using an infrared laser light having a longer wavelength than 700 nm.

9. The planographic printing plate precursor according to claim 7, wherein the layer (b) comprises a hydrophobic polymer having at least one of groups represented by the general formulae (1) and (3) in a side chain, said side chain being made hydrophilic by heating General formula (1)

$$—L—SO_2—O—R^1$$

General formula (2)

$$—L—SO_2—SO_2—R^2$$

General formula (3)

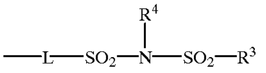

wherein, L represents an organic group composed of a polyvalent non-metal atom necessary for connecting a substituent to a polymer main chain, $R^1$ represents a substituted or unsubstituted alkyl group, a substituted or unsubstituted aryl group, or a cyclic imide group, $R^2$ and $R^3$ represent a substituted or unsubstituted alkyl group or a substituted or unsubstituted aryl group, and $R^4$ represents a substituted or unsubstituted alkyl group.

10. A planographic printing plate precursor obtained by laminating on a substrate (b) a layer composed of a hydrophobic polymer which can be made hydrophilic by heating, and (c) a layer of which exposed portions can be removed by heat mode exposure wherein the layer (c) and the layer (b) are laminated sequentially on a substrate having a hydrophilic surface.

11. A planographic printing plate precursor according to claim 10, wherein the layer (b) is composed of a hydrophobic polymer having at least one of groups represented by general formulae (1) and (5) in the side chain wherein said side chain is made hydrophilic by heating General formula (1)

$$—L—SO_2—O—R^1$$

General formula (2)

$$—L—SO_2—SO_2—R^2$$

-continued

General formula (3)

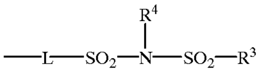

General formula (4)

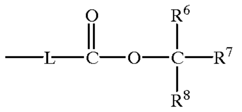

General formula (5)

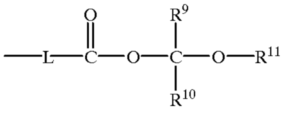

wherein, L represents an organic group composed of a polyvalent non-metal atom necessary for connecting a substituent to a polymer main chain, $R^1$ represents a substituted or unsubstituted alkyl group, a substituted or unsubstituted aryl group, or a cyclic imide group, $R^2$ and $R^3$ represent a substituted or unsubstituted alkyl group or a substituted or unsubstituted aryl group, $R^4$ represents a substituted or unsubstituted alkyl group, a substituted or unsubstituted aryl group, or $—SO_2—R^5$, $R^5$ represents a substituted or unsubstituted alkyl group or a substituted or unsubstituted aryl group, $R^6$ to $R^{10}$ each independently represent a hydrogen atom, or an alkyl group, alkenyl group, acyl group, or alkoxycarbonyl group which may have a substituent, $R^{11}$ represents an alkyl group or alkenyl group which may have a substituent, and any two of $R^6$ to $R^8$ or any two of $R^9$ to $R^{11}$ may be connected to form ring structure composed of 3 to 8 carbon atoms or hetero atoms.

12. A method for producing a planographic printing plate wherein the planographic printing plate precursor of claim 11 is subjected to heat mode exposure using an infrared laser light having a longer wavelength than 700 nm.

13. A method for producing a planographic printing plate wherein the planographic printing plate precursor of claim 10 is subjected to heat mode exposure using an infrared laser light having a longer wavelength than 700 nm.

14. The planographic printing plate precursor according to claim 10, wherein the layer (b) comprises a hydrophobic polymer having at least one of groups represented by the general formulae (1) to (3) in a side chain, said side chain being made hydrophilic by heating General formula (1)

$$—L—SO_2—O—R^1$$

General formula (2)

$$—L—SO_2—SO_2—R^2$$

General formula (3)

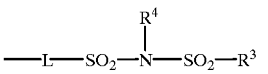

wherein, L represents an organic group composed of a polyvalent non-metal atom necessary for connecting a substituent to a polymer main chain, $R^1$ represents a substituted or unsubstituted alkyl group, a substituted or unsubstituted aryl group, or a cyclic imide group, $R^2$ and $R^3$ represent a substituted or unsubstituted alkyl group or a substituted or unsubstituted aryl group, and $R^4$ represents a substituted or unsubstituted alkyl group.

* * * * *